(12) United States Patent
Tsuchi

(10) Patent No.: US 7,872,499 B2
(45) Date of Patent: Jan. 18, 2011

(54) LEVEL SHIFT CIRCUIT, AND DRIVER AND DISPLAY SYSTEM USING THE SAME

(75) Inventor: Hiroshi Tsuchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/320,778

(22) Filed: Feb. 4, 2009

(65) Prior Publication Data
US 2009/0195291 A1    Aug. 6, 2009

(30) Foreign Application Priority Data
Feb. 6, 2008 (JP) ............................. 2008-026548

(51) Int. Cl.
*H03K 19/0175* (2006.01)
*H03L 5/00* (2006.01)
(52) U.S. Cl. .............................. 326/81; 326/62; 326/80; 327/333
(58) Field of Classification Search ............. 326/62–63, 326/80–81; 327/333
See application file for complete search history.

(56) References Cited

U.S. PATENT DOCUMENTS

| | | | | |
|---|---|---|---|---|
| 5,469,080 A * | 11/1995 | Son | ............................. | 326/81 |
| 5,486,785 A * | 1/1996 | Blankenship | ................ | 327/306 |
| 5,796,313 A * | 8/1998 | Eitan | ............................ | 331/57 |
| 5,844,767 A * | 12/1998 | Komiya et al. | ........ | 365/189.11 |
| 6,445,210 B2 * | 9/2002 | Nojiri | .......................... | 326/68 |
| 7,295,038 B2 * | 11/2007 | Seo | .............................. | 326/81 |
| 7,301,386 B2 * | 11/2007 | Chen et al. | .................. | 327/333 |
| 7,327,163 B2 * | 2/2008 | Chauhan et al. | ............... | 326/68 |
| 7,489,178 B2 * | 2/2009 | Yeung | ......................... | 327/333 |
| 7,511,551 B2 * | 3/2009 | Lee | ............................. | 327/333 |
| 7,652,505 B2 * | 1/2010 | Kanzaki | ...................... | 326/81 |
| 7,696,804 B2 * | 4/2010 | Thorp et al. | ................. | 327/333 |

(Continued)

FOREIGN PATENT DOCUMENTS

JP          9-93114          4/1997

(Continued)

*Primary Examiner*—James H. Cho
*Assistant Examiner*—Matthew C Tabler
(74) *Attorney, Agent, or Firm*—McGinn IP Law Group, PLLC

(57) ABSTRACT

Disclosed is a level shift circuit that includes a first level shifter which is connected between an output terminal and a first power supply terminal that supplies a first voltage and sets the output terminal to a level of the first voltage when an input signal received at an input terminal assumes a first value; a second level shifter which is connected between the output terminal and a second power supply terminal that supplies a second voltage and sets the output terminal to a level of the second voltage when the input signal assumes a complementary value of the first value; and a feedback control unit that performs control of deactivating the first level shifter during a predetermined time interval including a point of time when the input signal is supplied when it is detected that the output terminal immediately before the input signal is received at the input terminal assumes the first voltage level. When the input signal supplied in the predetermined time interval assumes a value that sets the output terminal to the second voltage level, the second level shifter sets the output terminal to the second voltage level with the first level shifter deactivated.

12 Claims, 14 Drawing Sheets

U.S. PATENT DOCUMENTS

| | | | |
|---|---|---|---|
| 7,696,805 B2 * | 4/2010 | Thorp et al. | 327/333 |
| 2001/0013795 A1 * | 8/2001 | Nojiri | 326/81 |
| 2005/0237084 A1 * | 10/2005 | Chauhan et al. | 326/81 |
| 2006/0033530 A1 * | 2/2006 | Seo | 326/81 |
| 2007/0188193 A1 * | 8/2007 | Narwal et al. | 326/80 |
| 2008/0074148 A1 * | 3/2008 | Srivastava et al. | 326/68 |
| 2008/0246528 A1 * | 10/2008 | Inoue et al. | 327/333 |

FOREIGN PATENT DOCUMENTS

| | | |
|---|---|---|
| JP | 2001-298356 | 10/2001 |

* cited by examiner

US 7,872,499 B2

LEVEL SHIFT CIRCUIT, AND DRIVER AND DISPLAY SYSTEM USING THE SAME

FIELD OF THE INVENTION

Reference to Related Application

This application is based upon and claims the benefit of the priority of Japanese patent application No. 2008-026548 filed on Feb. 6, 2008, the disclosure of which is incorporated herein in its entirety by reference thereto.

The present invention relates to a level shift circuit and a driver and a display system that use the level shift circuit.

BACKGROUND ART

Recently, in the field of display systems, displays that use various display devices, such as a liquid crystal display system and a display that uses organic EL (Electro Luminescence) elements, have been developed. Higher image quality (increased gray scales) is demanded for these display systems, and voltage amplitudes of a scan signal and a gray scale signal tend to be increased. For this reason, higher voltages of respective output sections of a row driver that drives a scan line of a display panel and a column driver that drives a data line of the display panel using the gray scale signal are demanded.

On the other hand, higher-speed transfer and low EMI (Electromagnetic Interference) or the like using a small number of signal lines are demanded for various control signals and image data signals supplied to the row driver (scan driver) and the column driver (data driver) from a display controller. Lower amplitudes of those signals are being achieved. Further, even in the row driver and the column driver, a fine fabrication process has been adopted in order to reduce an increase in the area (cost) of logic circuits that handle data, the amount of which increases accompanying a higher definition and the increased gray scales. With the fine fabrication process, the power supply voltage of each logic circuit tends to be reduced.

That is, lower voltages of input sections of the row driver and the column driver and higher voltages of the output sections of the row driver and the column driver are demanded.

For this reason, in a level shift circuit that converts a low-voltage signal in an input section thereof to a high-voltage signal in an output section thereof, a low-amplitude signal must be converted to a high-amplitude signal at high speed.

FIG. 13 is a diagram showing an example of a typical configuration of the level shift circuit that converts a low-amplitude signal to a high-amplitude signal (refer to Patent Document 1 listed below). This level shift circuit receives a low-voltage signal IN and outputs a high-voltage output signal OUT and a high-voltage output signal OUTB which is a reverse phase signal of the signal OUT. The level shift circuit includes P-channel MOS transistors P1 and P2 which have sources connected to a power supply terminal VDD3, have gates connected to output terminals W2 and W1, respectively, and have drains connected to the output terminals W1 and W2, respectively. The P-channel MOS transistors P1 and P2 function as charging elements for the output terminals W1 and W2, respectively. The P-channel MOS transistors P1 and P2 respectively receive at the gates thereof the high-amplitude output signal OUT output from the output terminal W2 and the output signal OUTB output from the output terminal W1. The maximum absolute value of a gate-to-source voltage VGS of each of the P-channel MOS transistors P1 and P2 is |VSS-VDD3|. N-channel MOS transistors N1 and N2 function as discharging elements for the output terminals W1 and W2, respectively. The N-channel MOS transistors N1 and N2 have sources connected to a power supply terminal VSS and have drains connected to the output terminals W1 and W2, respectively. The N-channel MOS transistors N1 and N2 respectively receive at gates thereof the low-voltage input signal IN and the inverted signal of the input signal IN (both being low-amplitude signals).

The maximum gate-to-source voltage of each of the discharging elements N1 and N2 is set to the amplitude of the input signal IN. Discharging capability of each of the discharging elements N1 and N2 is lower than charging capability of each of the charging elements P1 and P2 of which the maximum absolute value of the gate-to-source voltage VGS is |VSS-VDD3|. A drain current of each of the discharging elements N1 and N2 and the charging elements P1 and P2 is proportional to the square of [(gate-to-source voltage)−(threshold voltage)], for example. A drain current of each of the charging elements P1 and P2, whose gate-to-source voltage at an on time is set to a larger value, is larger than a drain current of each of the discharging elements N1 and N2.

Then, in order to increase discharging capability of the respective discharging elements N1 and N2, the element size of the respective discharging elements N1 and N2 (W/L ratio; where W is a channel width, and L is a channel length) needs to be sufficiently large.

By the way, the discharging capability of the respective discharging elements N1 and N2 must be set to exceed the charging capability of the respective charging elements P1 and P2. This can be readily understood in view of a discharging operation of the respective discharging elements N1 and N2.

As a specific example, a change from a state (initial state) where the output terminals W1 and W2 respectively have a potential VDD3, (which is a High potential) and a potential VSS, (which is a Low potential) will be considered, for example. In this state, the charging element P1 is in an on state, while the charging element P2 is in an off state. Further, the input signal IN is Low, the discharging element N1 is in an off state, and the discharging element N2 is in an on state.

Then, when the input signal IN is changed from a Low level to a High level, the discharging element N1 is turned on, and the discharging element N2 is turned off. However, the charging element P1 immediately after the change of the input signal IN from the Low level to the High level of a low amplitude is kept in the on state. Thus, in order to change the output terminal W1 to Low (VSS) by the discharging element N1, the discharging capacity of the discharging element N1 (drain current of the N-channel MOS transistor N1) needs to exceed the charging capability of the charging element P1 (drain current of the P-channel MOS transistor P1).

Accordingly, in order to cause the level shift circuit in FIG. 13 to operate normally, the element size (W/L ratio) of the respective discharging elements N1 and N2 must be set to be sufficiently large, and also the element size (W/L ratio) of the respective charging elements P1 and P2 must be set to be sufficiently small so that the discharging capability exceeds the charging capability.

That is, the size of each of the discharging elements in the level shift circuit in FIG. 13 is increased and the area of the level shift circuit is increased. Especially when operated at low voltage of the input signal IN, the discharging capability of the respective discharging elements N1 and N2 is relatively reduced. Thus, the circuit area will further increase.

Further, it becomes difficult to set the transistor size so that the discharging capability of the respective discharging elements N1 and N2 sufficiently exceeds the charging capability of the respective charging elements P1 and P2.

When the W/L ratios of the discharging elements N1 and N2 are increased, a level shift operation is slowed down due to an increase in parasitic capacitances. Thus, a time interval where the discharging element N1 and the charging element P1 are simultaneously in an on state or a time interval where the discharging element N2 and the charging element P2 are simultaneously in an on state is prolonged. Thus, there also arises a problem that short circuit current that flows transiently increases, so that power dissipation increases.

FIG. 14 is a diagram showing a configuration of a single-ended level shift circuit (refer to Patent Document 2 listed below). The single-ended level shift circuit includes an output-stage driver 12, a predriver 14, a feedback P-channel MOS transistor 16, a compensating N-channel MOS transistor 18, and a compensating N-channel MOS transistor 32. The output-stage driver 12 includes a P-channel MOS transistor 20 and an N-channel MOS transistor 22, and drives an output terminal OUT1 according to an output signal of the predriver 14. The P-channel MOS transistor 20 is connected between a high-potential power supply VCCH and the output terminal OUT1, and the N-channel MOS transistor 22 is connected between the output terminal OUT1 and the ground. Gates of the P-channel MOS transistor 20 and the N-channel MOS transistor 22 are connected to internal nodes N11 and N12, respectively. The predriver 14 includes a P-channel MOS transistor 24, an N-channel MOS transistor 26, and an N-channel MOS transistor 28, and drives the internal nodes N11 and N12 according to a signal supplied to an input terminal IN1. The P-channel MOS transistor 24 is connected between a low-potential power supply VCCL and the internal node N12. The N-channel MOS transistor 26 is connected between the internal node N12 and the ground, and the N-channel MOS transistor 28 is connected between the internal node N11 and the ground. Gates of the P-channel MOS transistor 24 and the N-channel MOS transistors 26 and 28 are all connected to the input terminal IN1. The feedback P-channel MOS transistor 16 is connected between the high-potential power supply VCCH and the internal node N11, has a gate connected to the output terminal OUT1, and drives the internal node N11 to a High level (high-potential power supply voltage VCCH) according to a signal driven to the output terminal OUT1. The compensating N-channel MOS transistor 18 is connected between the high-potential power supply VCCH and the internal node N11, has a gate connected to the internal node N12, and drives the internal node N11 to a High level (low-potential power supply voltage VCCL−threshold voltage VTH of N-channel MOS transistor 18) according to an output signal of the predriver 14. The N-channel MOS transistor 32 is connected between the high-potential power supply VCCH and the output terminal OUT1, and has a gate connected to the input terminal IN1.

In this level shift circuit, the compensating N-channel MOS transistor 18 is connected between the internal node N11 and the high-potential power supply VCCH, and the compensating N-channel MOS transistor 32 is connected between the output node OUT1 and the high-potential power supply VCCH. When an input signal IN1 is changed from Low to High, the compensating transistor 32 accelerates an increase in the potential at the output node OUT1 to a high voltage. When the input signal IN1 is changed from High to Low, the compensating transistor 18 accelerates an increase in the potential at the node N11. A level shift operation is thereby sped up.

[Patent Document 1] JP Patent Kokai Publication No. JP-P2001-298356A

[Patent Document 2] JP Patent Kokai Publication No. JP-A-9-93114

SUMMARY

The entire disclosures of Patent Documents 1 and 2 are incorporated herein by reference thereto. The following analyses are given by the present invention.

A result of analysis of the prior arts by the present invention will be given below.

In the level shift circuit in FIG. 13, there is a problem that a charging operation is interrupted by discharging current transiently generated at a time of the charging operation, so that a level shift operation is thereby slowed down, or power dissipation increases due to short circuit current transiently generated.

Then, when the above-mentioned problem is to be solved, the element size will be increased. Further, due to reduction of the voltage level (amplitude) of the input signal, the above-mentioned problem (such as slowing down of the level shift operation, or increase of the short circuit current) becomes more manifest. On the other hand, even if the element size is increased, the increased size is naturally limited. Accordingly, it is difficult to solve the above-mentioned problem.

In the level shift circuit in FIG. 14, when the voltages of the low-potential power supply VCCL and the high-potential power supply VCCH are comparatively close, there is an effect of the high-speed operation. However, when the high-potential power supply VCCH has a voltage sufficiently higher than the low-potential power supply VCCL, a problem of a delay of the level shift operation or an increase in the area will arise. This problem will be more specifically described below with reference to FIG. 14.

As an initial state, assume that each of the input signal IN1 and an output OUT1 has a GND voltage and the node N11 has a voltage VCCH. In this case, the node N12 has a voltage VCCL, the N-channel MOS transistor 22 is turned on, and the P-channel MOS transistor 20 is turned off. When the input signal IN1 is changed to the voltage VCCL from the initial state, the node N12 is changed to the GND voltage due to the transistors 24 and 26 that form a CMOS inverter, thereby turning off the N-channel MOS transistor 22. The compensating N-channel MOS transistor 32 that receives the input signal IN1 at the gate thereof raises the output OUT1 from the supply voltage VCCL to a potential lower than the supply voltage VCCL by a threshold voltage VTH of the compensating transistor 32 (VCCL−VTH) due to a source follower operation. In order for the output OUT1 to be further changed to the power supply voltage VCCH, the P-channel MOS transistor 20 must be turned on due to reduction of the voltage at the node N11. In order for the voltage at the node N11 to be reduced from the voltage VCCH to the GND voltage, a drain current (discharging current) of the N-channel MOS transistor 28 that receives the input signal IN at the gate thereof must be larger than a drain current (charging current) of the P-channel MOS transistor 16 that receives the output OUT1 at the gate thereof.

In this case, a gate-to-source voltage of the N-channel MOS transistor 28 is the voltage VCCL, and the absolute value of a gate-to-source voltage of the P-channel MOS transistor 16 is (VCCH−VCCL+VTH).

When the high-potential supply voltage VCCH is 5V, the low-potential supply voltage VCCL is 3V, and the threshold voltage VTH is 1.V, for example, as a case where the low-potential supply voltage VCCL and the high-potential supply voltage VCCH are comparatively close, (the absolute values of) the gate-to-source voltages of the N-channel MOS transistors 28 and the P-channel MOS transistor 16 both assume 3V. Thus, by adjusting a ratio of a channel width W to a channel length L of each of the transistors, the drain current (discharging current) of the N-channel MOS transistor 28 can be readily made larger than the drain current (charging current) of the P-channel MOS transistor 16.

However, when the high-potential supply voltage VCCH is 18V, the low-potential supply voltage VCCL is 3V, and the threshold voltage VTH is 1V, for example, as a case where the high-potential supply voltage VCCH is sufficiently higher than the low-potential supply voltage VCCL, (the absolute values of) the gate-to-source voltages of the N-channel MOS transistors 28 and the P-channel MOS transistor 16 assume 3V and 16V, respectively. In this case, in order to make the drain current (discharging current) of the N-channel MOS transistor 28 larger than the drain current (charging current) of the P-channel MOS transistor 16, the channel width W of the N-channel MOS transistor 28 must be made sufficiently large, and the channel length L of the P-channel MOS transistor 16 must be made sufficiently large.

Likewise, when the high-potential supply voltage VCCH is sufficiently higher than the low-potential supply voltage VCCL, the channel width W of the N-channel MOS transistor 22 must be made sufficient large and the channel length L of the P-channel MOS transistor 20 must be made sufficiently large in order for the output OUT1 to be changed from the voltage VCCH to the GND voltage with a change of the input signal IN1 from the voltage VCCL to the GND voltage.

It means that, when a low-amplitude input signal is level shifted to a signal of a sufficiently high amplitude in the level shift circuit in FIG. 14, there is a problem of an increase in the circuit area, an increase in power dissipation due to generation of a transient short circuit current, and an operation delay caused by the short circuit current, as in the case in FIG. 13.

Accordingly, an object of the present invention is to provide a level shift circuit which converts a low-amplitude input signal to a high-amplitude signal at high speed.

Another object of the present invention is to provide a multiple output driver that needs a lot of level shift circuits but can achieve lower power dissipation, area saving, (low cost) while implementing a higher-speed operation, and a display system including the driver.

The invention disclosed in this application is generally configured as follows.

According to one aspect (aspect) of the present invention, there is provided a level shift circuit including:

a first level shifter connected between a first power supply terminal that supplies a first voltage and an output terminal, the first level shifter setting the output terminal to a level of the first voltage when an input signal(of an amplitude smaller than the amplitude of an output signal) supplied to an input terminal assumes a first value;

a second level shifter connected between a second power supply terminal that supplies a second voltage and the output terminal, the second level shifter setting the output terminal to a level of the second voltage when the input signal assumes a complementary value of the first value; and a feedback control unit that controls switching between selection of one of a complementary signal of an output signal at the output terminal and the output signal at the output terminal or non-selection of the complementary signal of the output signal and the output signal at the output terminal based on control signals, supplies the selected signal to the first level shifter or the first and second level shifters to perform control of deactivating a level shift operation of at least one of the first level shifter and the second level shifter.

A level shift circuit according to the present invention includes:

a first level shifter connected between a first power supply terminal that supplies a first voltage and an output terminal, the first level shifter setting the output terminal to a level of the first voltage when an input signal (of an amplitude smaller than the amplitude of an output signal) supplied to an input terminal assumes a first value;

a second level shifter connected between a second power supply terminal that supplies a second voltage and the output terminal, the second level shifter setting the output terminal to a level of the second voltage when the input signal assumes a complementary value of the first value; and a feedback control unit that receives control signals that specify at least an prescribed time interval including a time point at which the input signal is received and performs control of deactivating the first level shifter during the predetermined time interval, when detecting that the output terminal immediately before the predetermined time interval assumes the first voltage level. When the input signal supplied in the predetermined time interval assumes a value (the complementary value of the first value) that sets the output terminal to the second voltage level, the second level shifter sets the output terminal to the second voltage level with a level shift operation of the first level shifter deactivated.

The level shift circuit according to the present invention includes:

the first level shifter connected between the first power supply terminal that supplies the first voltage and the output terminal, the first level shifter setting the output terminal to the first voltage level when the input signal supplied to the input terminal assumes the first value;

the second level shifter connected between the second power supply terminal that supplies the second voltage and the output terminal, the second level shifter setting the output terminal to the second voltage level when the input signal assumes the complementary value of the first value; and the feedback control unit that receives control signals that specify at least an prescribed time interval including a time point at which the input signal is received, performs control of deactivating the first level shifter during the predetermined time interval including the point of time at which the input signal is received, when it is detected that the output terminal immediately before the input signal is received at the input terminal assumes the first voltage level, and performs control of deactivating the second level shifter during the predetermined time interval, when it is detected that the output terminal assumes the second voltage level immediately before the predetermined time interval. When the input signal supplied in the predetermined time interval assumes a value (the complementary value of the first value) that sets the output terminal to the second voltage level, the second level shifter sets the output terminal to the second voltage level with a level shift operation of the first level shifter deactivated. When the input signal supplied in the predetermined time interval assumes a value (the first value) that sets the output terminal to the first voltage level, the first level shifter sets the output terminal to the first voltage level with a level shift operation of the second level shifter deactivated.

In the level shift circuit according to the present invention, a complementary signal of the input signal to be supplied to the first level shifter is supplied to the second level shifter.

In the level shift circuit according to the present invention, the first level shifter includes:

first through third transistors connected between the first power supply terminal and the second power supply terminal in series, the first through third transistors being sequentially arranged from a side of the second power supply terminal; and a fourth transistor connected between the first power supply terminal and the output terminal. The first transistor is of a first conductivity type, which is turned on when the input signal supplied to a control terminal thereof assumes the first value (logic value) and is turned off when the input signal assumes a complementary value of the first value. The second transistor is of the first conductivity type, which is turned on when a control terminal thereof assumes a second value (logic value) corresponding to the first voltage level and is turned off when the control terminal thereof assumes a complementary value of the second value. The third and fourth transistors are of a second conductivity type, each of which is turned on when a control terminal thereof assumes the complementary value of the second value, and is turned off when the control terminal thereof assumes the second value. A control terminal of the fourth transistor is connected to a connection node between the second and third transistors. The feedback control unit includes first and second switches having one ends thereof coupled together and the other ends thereof respectively connected to a complementary output terminal that outputs a complementary value of the signal of the output terminal and the output terminal. The first and second switches are controlled to be turned on or off in response to the control signals. The control terminals of the second and third transistors of the first level shifter are coupled together and connected to the one ends of the first and second switches of the feedback control unit, the one ends of the first and second switches being coupled together.

In the level shift circuit according to the present invention, the first level shifter includes:

first through third transistors connected between the first power supply terminal and the second power supply terminal in series, the first through third transistors being sequentially arranged from a side of the second power supply terminal; and a fourth transistor connected between the first power supply terminal and the output terminal. The first transistor is of a first conductivity type, which is turned on when a control terminal thereof assumes a second value corresponding to the first voltage level and is turned off when the control terminal thereof assumes a complementary value of the second value. The second transistor is of the first conductivity type, which is turned on when the input signal supplied to a control terminal thereof assumes the first value and is turned off when the input signal assumes a complementary value of the first value. The third and fourth transistors are of a second conductivity type, each of which is turned on when a control terminal thereof assumes the complementary value of the second value, and is turned off when the control terminal thereof assumes the second value. A control terminal of the fourth transistor is connected to a connection node between the second and third transistors. The feedback control unit includes first and second switches having one ends thereof coupled together and the other ends thereof respectively connected to a complementary output terminal that outputs a complementary value of the signal of the output terminal and the output terminal. The first and second switches are controlled to be turned on or off in response to the control signals. The control terminals of the first and third transistors of the first level shifter are coupled together and connected to the one ends of the first and second switches of the feedback control unit, the one ends of the first and second switches being coupled together.

In the level shift circuit according to the present invention, the second level shifter includes a fifth transistor connected between the output terminal and the second power supply terminal; and the fifth transistor is of the first conductivity type, which is turned on when the complementary signal of the input signal supplied to a control terminal thereof assumes the first value and is turned off when the complementary signal of the input signal assumes the complementary value of the first value.

In the level shift circuit according to the present invention, a control time interval of the first and second switches includes first through third time intervals;

a sum of the first time interval, the second time interval, and the third time interval is set to be the same as the cycle of the input signal;

in the first time interval, the first switch is turned on, and the second switch is turned off, based on the control signals;

in the second time interval, the first switch is turned off, and the second switch is turned off, based on the control signals;

in the third time interval, the first switch is turned off, and the second switch is turned on, based on the control signals; and the input signal is supplied within the second time interval.

In the level shift circuit according to the present invention, the second level shifter includes:

fifth through seventh transistors connected between the first power supply terminal and the second power supply terminal in series, the fifth through seventh transistors being sequentially arranged from the side of the second power supply terminal;

an eighth transistor connected between the second power supply terminal and the output terminal;

a first inverter having an input end thereof connected to a connection node between the sixth and seventh transistors and having an output end thereof connected to a control terminal of the eighth transistor; and a second inverter having an input end thereof connected to the one ends of the first and second switches of the feedback control unit, the one ends of the first and second switches being coupled together. The sixth transistor is of the first conductivity type, which is turned on when the complementary signal of the input signal supplied to a control terminal thereof assumes the first value and is turned off when the complementary signal of the input signal assumes the complementary value of the first value. Each of the fifth and eighth transistors is of the first conductivity type, which is turned on when a control terminal thereof assumes the second value, and is turned off when the control terminal thereof assumes the complementary value of the second value. The seventh transistor is of the second conductivity type, which is turned on when a control thereof assumes the complementary value of the second value and is turned off when the control thereof assumes the second value. The control terminals of the fifth and seventh transistors are coupled together and connected to an output end of the second inverter.

In the level shift circuit according to the present invention, the second level shifter includes:

fifth through seventh transistors connected between the first power supply terminal and the second power supply terminal in series, the fifth through seventh transistors being sequentially arranged from the side of the second power supply terminal;

an eighth transistor connected between the second power supply terminal and the output terminal;

a first inverter having an input end thereof connected to a connection node between the sixth and seventh transistors and having an output end thereof connected to a control terminal of the eighth transistor; and a second inverter having an input end thereof connected to the one ends of the first and second switches of the feedback control unit, one ends of the first and second switches being coupled together. The fifth transistor is of the first conductivity type, which is turned on when the complementary signal of the input signal supplied to a control terminal thereof assumes the first value and is turned off when the complementary signal of the input signal assumes the complementary value of the first value. Each of the sixth and eighth transistors is of the first conductivity type, which is turned on when a control terminal thereof assumes the second value, and is turned off when the control terminal thereof assumes the complementary value of the second value. The seventh transistor is of the second conductivity type, which is turned on when a control terminal thereof assumes the complementary value of the second value and is turned off the control terminal thereof assumes the second value. The control terminals of the sixth and seventh transistors are coupled together and connected to an output end of the second inverter.

A level shift circuit according to the present invention includes:

first through third transistors connected between a first power supply terminal that supplies a first voltage and a second power supply terminal that supplies a second voltage in series, the first through third transistors being sequentially arranged from a side of the second power supply terminal;

a fourth transistor connected between the first power supply terminal and an output terminal;

a fifth transistor connected between the output terminal and the second power supply terminal; and first and second switches having one ends thereof coupled together and the other ends thereof respectively connected to a complementary output terminal that outputs a complementary value of a signal of the output terminal and the output terminal, the first and second switches being controlled to be turned on or off, in response to control signals. The first, second, and fifth transistors are of a first conductivity type. The third and fourth transistors are of a second conductivity type. An input signal of a relatively low amplitude relative to the signal of the output terminal is supplied to one of control terminals of the first and second transistors. A complementary signal of the input signal is supplied to a control terminal of the fifth transistor. A control terminal of the third transistor and the other of the control terminals of the first and second transistors may be connected in common to the one ends of the first and second switches, the one ends of the first and second switches being coupled together. In the level shift circuit according to the present invention, the input signal is supplied in a predetermined cycle. A control time interval of the first and second switches includes first through third time intervals. A sum of the first time interval, the second time interval, and the third time interval is set to be the same as the cycle of the input signal. In the first time interval, the first switch may be turned on, and the second switch may be turned off, based on the control signals. In the second time interval, the first switch may be turned off, and the second switch may be turned off, based on the control signals. In the third time interval, the first switch may be turned off, and the second switch may be turned on, based on the control signals, and the input signal may be supplied within the second time interval.

According to the present invention, there is provided a scan driver including:

level shift circuits each of which receives a signal of a relatively low amplitude from a corresponding stage of a shift register that transfers a transfer signal, level shifts the signal of the relatively low amplitude to a signal of a relatively high amplitude, and outputs the level shifted signal; and buffers that receive the level shifted signal of a relatively high amplitude output from the level shift circuits and drive scan lines of a display panel. The level shift circuit according to the present invention is provided as each of the level shift circuits.

According to the present invention, there is provided a data driver including:

level shift circuits each of which receives a signal of a relatively low-amplitude signal from a latch circuit that latches digital data and performs level shifting of the signal to a signal of a relatively high amplitude, for output;

digital-to-analog converters, each of which receives the level shifted signals of a relatively high amplitude from at least one of the level shift circuits and converts the received signals to an analog signal; and buffers each of which receives the analog signal output from the digital-to-analog converter and drives a data line of a display panel. As each of the level shift circuits, the level shift circuit according to the present invention is provided.

According to the present invention, a display system including the scan driver is provided. According to the present invention, a display system including the data driver is provided.

According to the present invention, a delay of an output signal relative to an input signal is scarcely generated, and a low-amplitude input signal can be converted to a high-amplitude signal.

According to the present invention, a multiple output driver that needs a lot of level shift circuits and a display system including the driver implement a higher-speed operation, lower power dissipation, and area saving (low cost).

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES OF THE INVENTION

Figure 1:
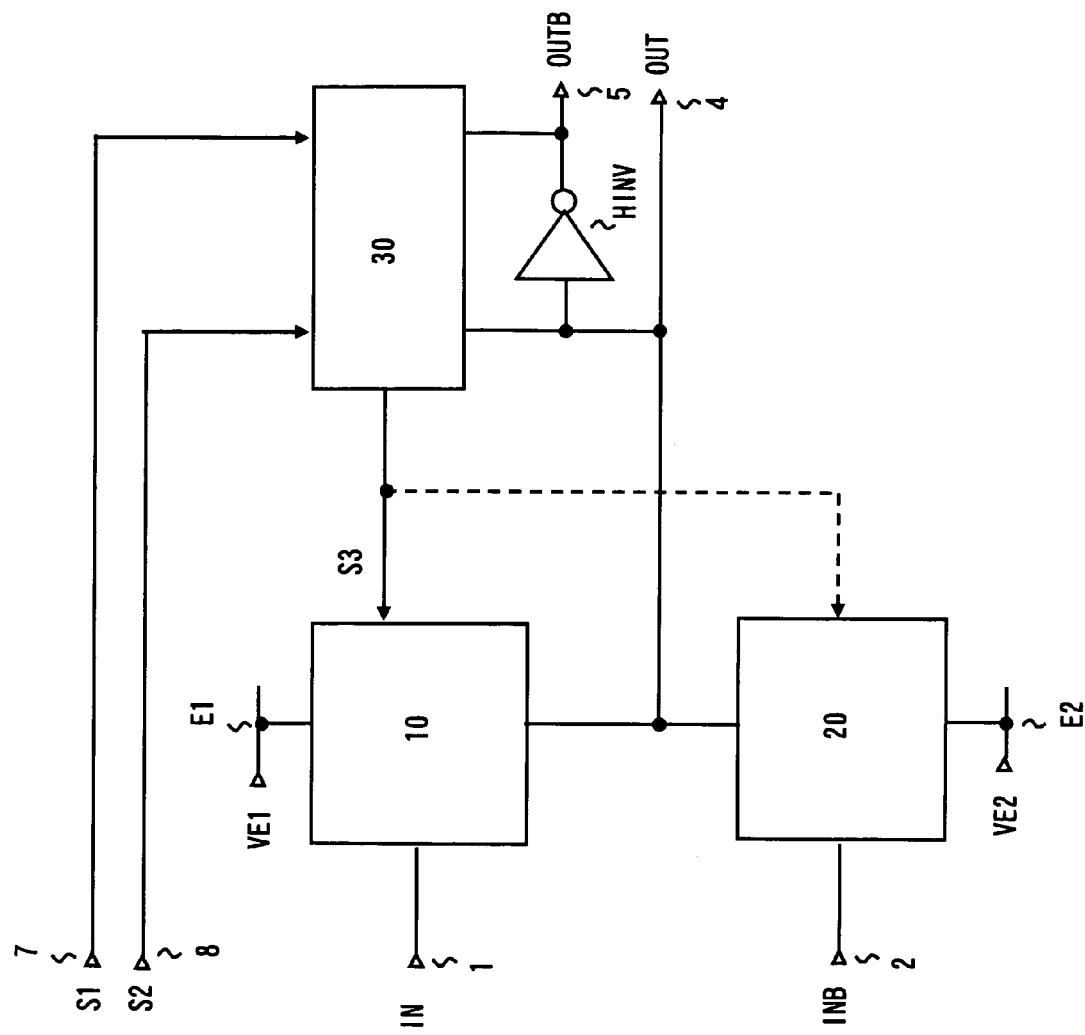
FIG. 1 is a diagram showing a configuration of exemplary embodiment 1 of the present invention.
Figure 1:
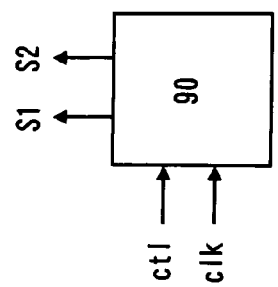

The present invention in further detail, a description will be given below with reference to appended drawings. According to one aspect of the present invention, a level shift circuit (refer to FIG. 1) includes:

a first level shifter (10) which is connected between a first power supply terminal (E1) that supplies a first voltage (VE1) and an output terminal (4), and sets the output terminal (4) to a first voltage level (VE1) when an input signal (IN) supplied to an input terminal (1) assumes a first value;

a second level shifter (20) which is connected between a second power supply terminal (E2) that supplies a second voltage (VE2) and the output terminal (4) and sets the output terminal (4) to a second voltage level (VE2) when the input signal (IN) assumes a complementary value of the first value; and a feedback control unit (30) which performs switching between selection of one of an output signal (OUT) of the output terminal (4) and a complementary signal (OUTB) of the output signal (OUT) of the output terminal (4) and non-selection of both of the output signal (OUT) and the complementary signal (OUTB) based on control signals (S1, S2), supplies the selected signal to the first level shifter (10) or the first and second level shifters (10, 20) as a signal (S3) that controls activation, thereby performing control of deactivating at least one of the first level shifter (10) and the second level shifter (20).

According to one aspect of a level shift circuit according to the present invention, there is provided a level shift circuit including:

a first level shifter (10) which is connected between a first power supply terminal (E1) that supplies a first voltage (VE1) and an output terminal (4) and sets the output terminal (4) to a level of the first voltage (VE1) when an input signal (IN) supplied to an input terminal (1) assumes a first value;

a second level shifter (20) which is connected between a second power supply terminal (E2) that supplies a second voltage (VE2) and the output terminal (4) and sets the output terminal (4) to a level of the second voltage (VE2) when the input signal (IN) assumes a complementary value of the first value; and a feedback control unit (30) that receives control signals (S1, S2) that specify at least an prescribed time interval including a time point at which the input signal (IN) is supplied to the input terminal (1) and performs control of deactivating the first level shifter during the predetermined time interval, when detecting that the output terminal (4) immediately before the predetermined time interval assumes the first voltage level (VE1) When the input signal supplied in the predetermined time interval assumes a value (complementary value of the first value) that drives the output terminal (4) to the second voltage level (VE2), the second level shifter (20) sets the output terminal (4) to the second voltage level (VE2) with a level shift operation of the first level shifter (10) to the first voltage level deactivated.

In the one aspect of the level shift circuit according to the present invention, the feedback control unit (30) performs control of deactivating the first level shifter (10) during the predetermined time interval when it is detected that the output terminal (4) assumes the first voltage level (VE1) immediately before the predetermined time interval and performs control of deactivating the second level shifter (20) during the predetermined time interval when it is detected that the output terminal (4) assumes the second voltage level (VE2) immediately before the predetermined time interval. When the input signal (IN) supplied in the predetermined time interval assumes the value (complementary value of the first value) that drives the output terminal (4) to the second voltage level (VE2), the second level shifter (20) sets the output terminal (4) to the second voltage level (VE2) with the level shifting operation of the first level shifter (10) to the first voltage level deactivated. When the input signal (IN) supplied in the predetermined time interval assumes the value (first value) that drives the output terminal (4) to the first voltage level (VE1), the first level shifter (10) may set the output terminal (4) to the first voltage level (VE1) with a level shift operation of the second level shifter (20) to the second voltage level deactivated.

In the level shift circuit according to the present invention, a complementary signal (INB) of the input signal (IN) to be supplied to the first level shifter (10) is supplied to the second level shifter (20).

Figure 3:
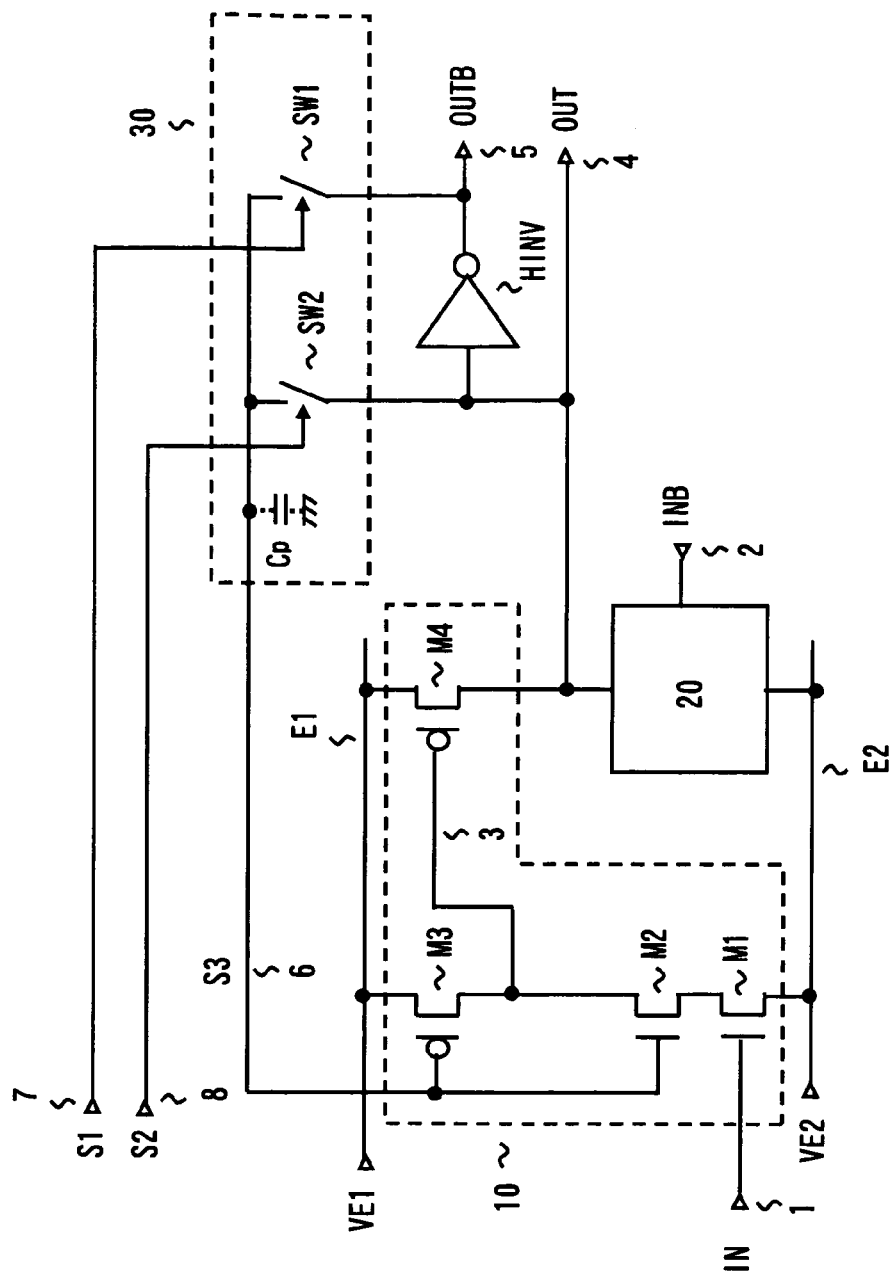
FIG. 3 is a diagram showing a configuration of exemplary embodiment 1-2 of the present invention.
Figure 3:
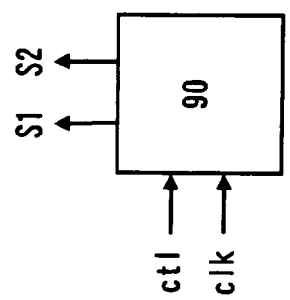

Referring to FIG. 3, in the level shift circuit according to the one aspect of the present invention, the first level shifter (10) includes:

first through third transistors (M1, M2, M3) series-connected (cascaded) between the first power supply terminal (E1) and the second power supply terminal (E2), arranged in this order from a side of the second power supply terminal (E2); and a fourth transistor (M4) connected between the first power supply terminal (E1) and the output terminal (4). The first transistor (M1) is of a first conductivity type, which is turned on when the input signal (IN) supplied to a control terminal thereof assumes the first value (logic value) and is turned off when the input signal assumes a complementary value of the first value. The second transistor (M2) is of the first conductivity type, which is turned on when a control terminal thereof assumes a second value (logic value) corresponding to the first voltage level (VE1) and is turned off when the control terminal thereof assumes a complementary value of the second value corresponding to the second voltage level (VE2). Each of the third and fourth transistors (M3, M4) is of a second conductivity type, which is turned on when a control terminal thereof assumes the complementary value of the second value, and is turned off when the control terminal thereof assumes the second value. A control terminal of the fourth transistor (M4) is connected to a connection node between the second and third transistors (M2, M3). The connecting order of the first and second transistors (M1, M2) may be interchanged (FIG. 2).

Figure 5:
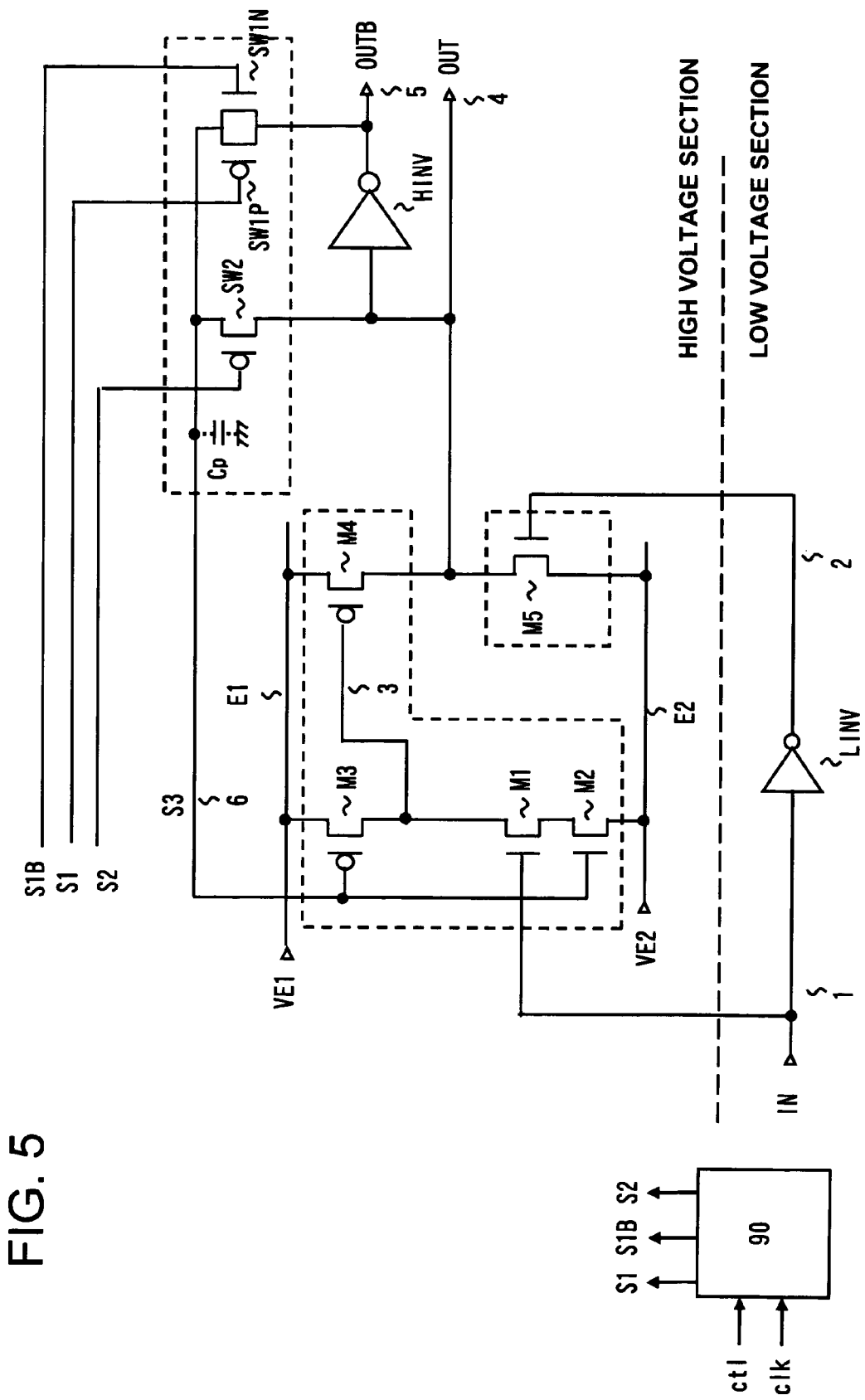
FIG. 5 is a diagram showing a configuration of exemplary embodiment 1-3 (a specific example of FIG. 2) of the present invention.

Referring to FIG. 5, in the level shift circuit according to the one aspect of the present invention, the second level shifter (20) includes a fifth transistor (M5) connected between the output terminal (4) and the second power supply terminal (E2). The fifth transistor (M5) is of the first conductivity type, which is turned on when the complementary signal (INB) of the input signal is supplied to a control terminal thereof and the complementary signal (INB) of the input signal assumes the first value and is turned off when the complementary signal (INB) of the input signal assumes the complementary value of the first value.

Figure 2:
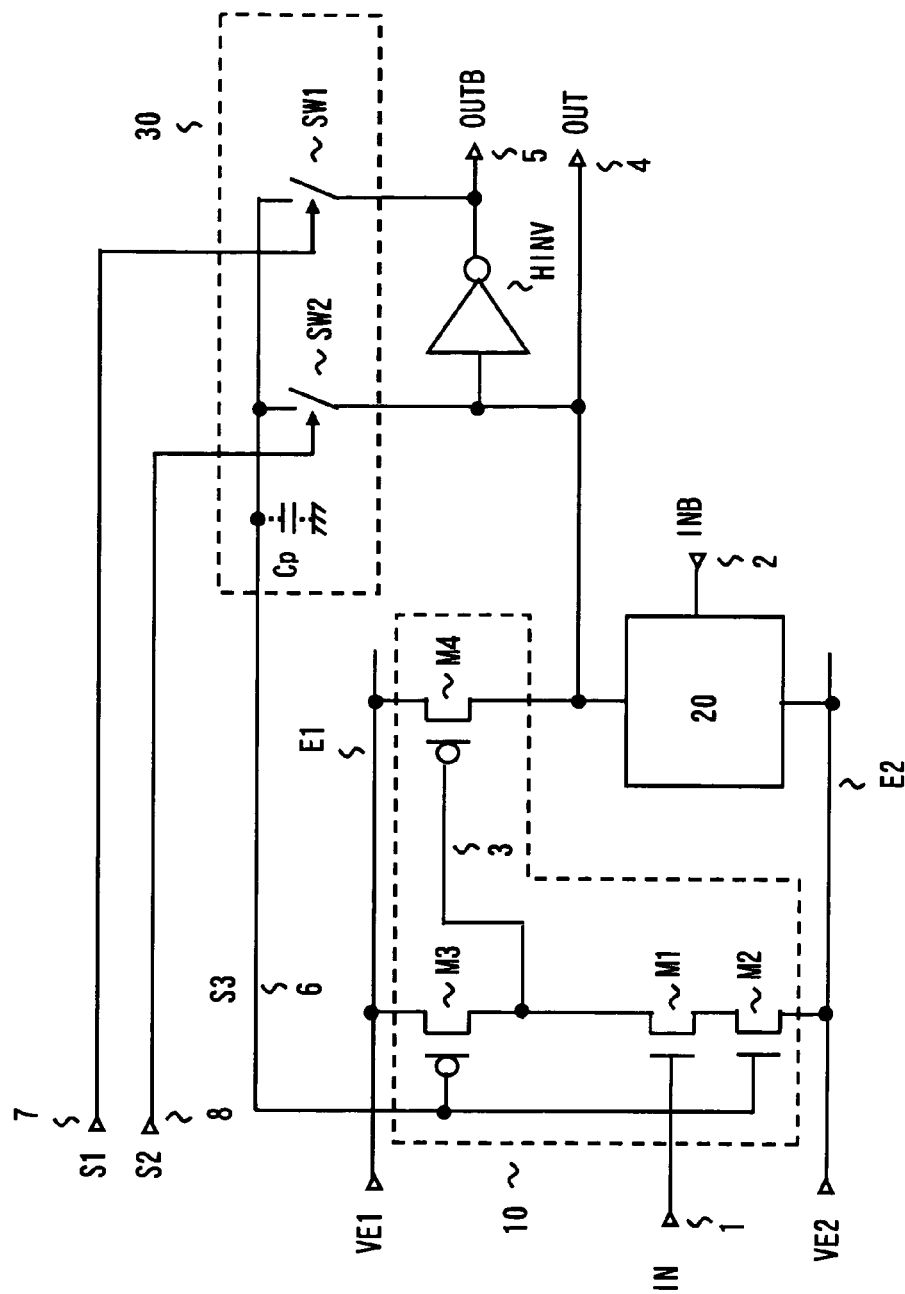
FIG. 2 is a diagram showing a configuration of exemplary embodiment 1-1 of the present invention.

Referring to FIG. 2 or 3, in the level shift circuit according to the one aspect of the present invention, the feedback control unit (30) includes first and second switches (SW1, SW2) having one ends (6) thereof coupled together and the other ends thereof respectively connected to a complementary output terminal (5) that outputs a complementary value (OUTB) of the signal of the output terminal (4) and the output terminal (4), the first and second switches being controlled to be turned on or off in response to the control signals (S1, S2); and the control terminals of the second and third transistors (M2, M3) of the first level shifter (10) are connected in common to the one ends (6) of the first and second switches (SW1, SW2), which are coupled together.

In the level shift circuit according to the present invention, the input signal (IN) is supplied in a predetermined cycle (which means that a data cycle has the predetermined cycle);

a control time interval of the first and second switches (SW1, SW2) of the feedback control unit (30) includes first through third time intervals (T1, T2, T3);

a sum of the first time interval, the second time interval, and the third time interval is set to be the same as the cycle of the input signal; and the input signal (IN) is supplied within the second time interval (T2) (which means that a point of time of change of the input signal is positioned within the second time interval T2).

In the feedback control unit (30), in the first time interval (T1), the first switch (SW1) is turned on, and the second switch (SW2) is turned off, based on the control signals (S1, S2);

in the second time interval (T2), the first switch (SW1) is turned off, and the second switch (SW2) is turned off, based on the control signals (S1, S2);

in the third time interval (T3), the first switch (SW1) is turned off, and the second switch (SW2) is turned on, based on the control signals (S1, S2); and the input signal (IN) is supplied within the second time interval (T2).

According to the present invention, control is performed so that a discharging side is turned off at a time of a charging operation, thereby eliminating short circuit current and implementing a higher-speed level shift operation. Since there is no short circuit current that is transiently generated, lower power dissipation is possible. The size of each element can also be made sufficiently small. Thus, even if the number of elements is increased, area saving can be performed. A description will be given below, in connection with exemplary embodiments.

Exemplary Embodiment 1

FIG. 1 is a diagram showing a configuration of an exemplary embodiment of a level shift circuit of the present invention. Referring to FIG. 1, this level shift circuit includes a first level shifter 10, a second level shifter 20, a feedback control unit 30, and a control signal generation circuit 90. Referring to FIG. 1, reference characters IN and INB indicate mutually complementary, low-amplitude input signals having amplitudes of third and fourth voltage levels (VE3 and VE4), reference characters OUT and OUTB indicate mutually complementary high-amplitude output signals having amplitudes of first and second voltage levels (VE1 and VE2), reference characters VE1 and VE2 indicate a voltage of a high-potential first power supply and a voltage of a low potential second power supply, respectively, reference character clk indicates a clock signal of a low amplitude having third and fourth voltage levels (VE3 and VE4), reference character ctl indicates a timing control signal of a low amplitude having amplitudes of third and fourth voltage levels (VE3 and VE4), and reference characters S1, S2, and S3 indicate control signals of high amplitudes having amplitudes of first and second voltage levels (VE1 and VE2).

The first level shifter 10 is connected between a first power supply terminal (E1) that supplies the first voltage level (VE1) and an output terminal (non-inverted output terminal) 4. The first level shifter 10 receives the low-amplitude input signal (IN), and drives the output terminal 4 to the first voltage level (VE1) responsive to a change in the voltage level of the input signal (IN).

The second level shifter 20 is connected between a second power supply terminal (E2) that supplies the second voltage level (VE2) and the output terminal 4. The second level shifter 20 receives the complementary signal (INB) of the input signal (IN), and responsive to a change in the voltage level of the complementary signal (INB), the second level shifter 20 drives the output terminal 4 to the second voltage level (VE2, which is smaller than the voltage level VE1).

The control signal generation circuit 90 receives the reference signal (clk) of the low amplitude and the timing signal (ctl) of the low amplitude, and generates the high-amplitude control signals S1 and S2.

The feedback control unit 30 receives the high-amplitude output signal (OUT) from the output terminal 4 and the high-amplitude complementary output signal (OUTB) from a complementary output terminal (inverted output terminal) 5, and selects the output signal (OUT) or the complementary output signal (OUTB) responsive to the high-amplitude first and second control signals (S1, S2), and outputs the selected signal as the high-amplitude third control signal (S3). The complementary output terminal 5 is connected to an output of an inverter HINV with an input thereof connected to the output terminal 4. The input and output of the inverter HINV have high amplitudes (VE1, VE2).

The first level shifter 10 receives the third control signal (S3) from the feedback control unit 30. In response to the third control signal (S3), activation (driving operation) and deactivation (driving operation stop) are controlled. Activation (driving operation) and deactivation (driving operation stop) of the second level shifter 20 may be controlled by the third control signal S3, if necessary.

The third and fourth voltage levels (VE3, VE4) of the input signal (IN) are set between the first and second voltage levels (VE1, VE2). Then, the amplitudes of the third and fourth voltage levels (VE3, VE4) are set to be smaller than the amplitudes of the first and second voltage levels. That is, $VE2 \leq VE4 < VE3 < VE1$ is set. Referring to FIG. 1, a high-potential power supply and a low-potential power supply are referred to as the first power supply and the second power supply, for convenience.

In this exemplary embodiment, first, second, and third time intervals are provided as control time intervals in accordance with the high-amplitude first and second control signals (S1, S2) output from the control signal generation circuit 90.

A first time interval (T1) is set earlier than a time when the change in the voltage level of the input signal (IN) is expected, by a predetermined time interval. In this time interval, the first level shifter 10 or the second level shifter 20 is controlled so as to allow a voltage level at the output terminal 4 to be changed.

Specifically, when a voltage at the output terminal 4 assumes the first voltage level (VE1), for example, the level shifter 10 is deactivated (or the driving operation thereof is stopped)

A second time interval (T2) is set, including the time at which the change in the voltage level of the input signal (IN) is expected. According to the input signal (IN) or the complementary input signal (INB), the output terminal 4 is set to the first voltage level (VE1) or the second voltage level (VE2) by the first level shifter 10 or the second level shifter 20.

In a third time interval (T3), the first level shifter 10 or the second level shifter 20 is controlled so that the voltage level at the output terminal 4 driven in the second time interval (T2) is held.

In each of the first time interval T1, second time interval T2, and third time interval T3, at least one of the first level shifter 10 and the second level shifter 20 is deactivated (or the driving operation thereof is stopped).

In the second time interval (T2), the first level shifter 10 or the second level shifter 20 changes the voltage level at the output terminal 4 responsive to changes in the voltage levels of the input signal (IN) and the complementary input signal (INB). In this case, when one of the first level shifter 10 and the second level shifter 20 is activated (or performs the driving operation), the other of the first level shifter 10 and the second level shifter 20 is deactivated (or stops the driving operation). Thus, a high-speed level shift operation can be performed, and lower power dissipation can be implemented with no short circuit current generated.

In the third time interval (T3), the first level shifter 10 or the second level shifter 20 operates so that the voltage level at the output terminal 4 is held. For this reason, variation of the voltage level at the output terminal 4 due to an influence of noise or the like and resulting occurrence of a malfunction can be avoided.

When the input signal (IN) is a signal such as a data signal that is supplied in a predetermined cycle in this exemplary embodiment, for example, it is preferable that the first, second, and third time intervals (T1, T2, T3) are set in the same cycle as that of one data time interval. That is, it is set that T1+T2+T3=one data time interval.

Exemplary Embodiment 1-1

FIG. 2 is a diagram showing an example of configurations of the level shifter 10 and the feedback control unit 30 in FIG. 1. Referring to FIG. 2, the feedback control unit 30 in this exemplary embodiment includes:

a switch SW1 with one end thereof connected to a complementary output terminal 5 (which is an output end of an inverter HINV with an input end thereof connected to an output terminal 4) and with the other end thereof connected to a node 6; and a switch SW2 with one end thereof connected to the output terminal 4 and the other end thereof connected to the node 6. The switch SW1 is controlled to be turned on or off according to a high-amplitude control signal S1 supplied to a terminal 7 from a control signal generation circuit 90. The switch SW2 is controlled to be turned on or off according to a high-amplitude control signal S2 supplied to a terminal 8 from the control signal generation circuit 90.

When the switch SW1 or the switch SW2 is turned on, a complementary output signal OUTB (output of the inverter HINV) or an output signal OUT is alternatively output to the node 6.

When the switches SW1 and SW2 are both turned off, a voltage level at the terminal 6 immediately before the switches SW1 and SW2 are turned off is held by a parasitic capacitance Cp.

A high-amplitude output signal (voltage signal at the node 6) from the feedback control unit 30 controls an operation of the first level shifter 10 as a control signal S3.

The first level shifter 10 includes:

an N-channel MOS transistor M2 with a source thereof connected to a second power supply terminal E2 and a gate thereof connected to the node 6;

an N-channel MOS transistor M1 with a source thereof connected to a drain of the N-channel MOS transistor M2 and a gate thereof connected to a terminal 1;

a P-channel MOS transistor M3 with a source thereof connected to a first power supply terminal E1 and a gate thereof connected to the node 6; and a P-channel MOS transistor M4 with a source thereof connected to the first power supply terminal E1, with a gate thereof connected to a connecting node 3 between a drain of the P-channel MOS transistor M3 and a drain of the N-channel MOS transistor M1, and with a drain thereof connected to the output terminal 4.

In this exemplary embodiment, the control signal S3 of a high amplitude from the feedback control unit 30 is supplied to the first level shifter 10 alone. The P-channel MOS transistor M3 and the N-channel MOS transistor M2 that receive the high-amplitude control signal S3 at the gates thereof are of a mutually inverse conductive type. Thus, when one of the MOS transistors M3 and M2 is turned on, the other of the MOS transistors M3 and M2 is turned off. There is therefore no short circuit current between power supplies. Accordingly, there is substantially no current dissipation.

When the control signal S3 is at a Low level (VE2) of a high amplitude in the first level shifter 10, the N-channel MOS transistor M2 is turned off and the P-channel MOS transistor M3 is turned on in the first level shifter 10, thereby driving a node 3 to a High level (VE1) of the high amplitude, irrespective of an input signal IN. For this reason, the P-channel MOS transistor M4 with the gate thereof (node 3) driven to a High potential is turned off, thereby turning off a current path between the output terminal 4 and the first voltage terminal E1. An operation of driving the output terminal 4 to the first voltage level VE1 is thereby stopped.

When the control signal S3 is at a High level (VE1) of the high amplitude, the P-channel MOS transistor M3 is turned off and the N-channel MOS transistor M2 is turned on. In this case, when the input signal IN is at a High level (VE3) of a low amplitude, the N-channel MOS transistor M1 is turned on, thereby driving the node 3 to a Low level (VE2) of the high amplitude. The P-channel MOS transistor M4 is therefore turned on, thereby turning on the current path between the output terminal 4 and the first voltage terminal E1. Driving the output terminal 4 to the first voltage level (VE1) is thereby allowed.

When a complementary input signal INB is at a High level (VE3) of the low amplitude, the second level shifter 20 drives the output terminal 4 to the second voltage level (VE2).

Exemplary Embodiment 1-2

FIG. 3 shows a configuration in which connections to the N-channel MOS transistors M1 and M2 of a cascode connection in FIG. 2 have been interchanged. In the example in FIG. 3, a source of an N-channel MOS transistor M1 that receives an input signal IN at a gate thereof is connected to a second power supply terminal VE2, a source of an N-channel MOS transistor M2 that receives a control signal S3 at a gate thereof is connected to a drain of the N-channel MOS transistor M1, and a connecting node 3 between a drain of a P-channel MOS transistor M3 and a drain of the N-channel MOS transistor M2 is connected to a gate of a P-channel MOS transistor M4. Since a circuit operation in FIG. 3 is the same as that in FIG. 2, descriptions of the configuration and an operation of the circuit in FIG. 3 will be omitted.

Figure 4:
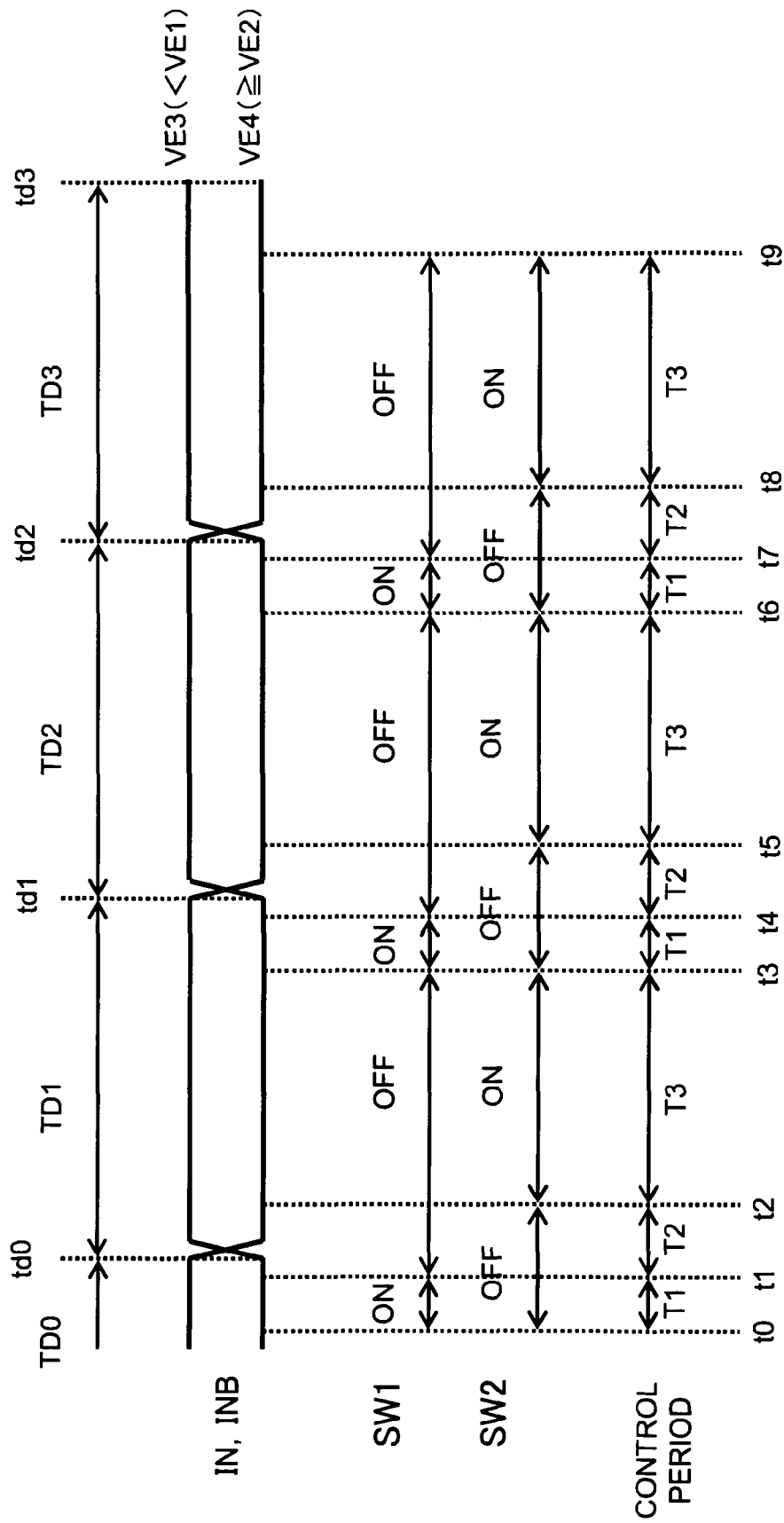
FIG. 4 is a diagram showing a timing operation example of exemplary embodiments 1-1 and 1-2 of the present invention.

FIG. 4 is a diagram showing control timings of the switches SW1 and SW2 of the feedback control unit 30 when the input signal is a signal such as a data signal supplied in a predetermined cycle in the level shift circuit in each of FIGS. 2 and 3. FIG. 4 schematically shows voltage waveforms of the input signal IN and the complementary input signal INB, turning on and off of the switches SW1 and SW2, and control timings of a first time interval T1, a second time interval T2, and a third time interval T3. FIG. 4 shows a first time interval T1, a second time interval T2, and a third time interval T3 defined by the control signals S1 and S2, for each of four data time intervals TD0, TD1, TD2, and TD3.

First time intervals T1 are set to a time interval (t0-t1) (in the data time interval TD0) before a start time td0 of the data time interval TD1) of the input signal IN, a time interval (t3-t4) (in the data time interval TD1) before a start time td1 of the data time interval TD2 of the input signal IN, and a time interval (t6-t7) (in the data time interval TD2) before a start time td2 of the data time interval TD3 of the input signal IN.

Second time intervals T2 are set to a time interval (t1-t2) including the start time td0 of the data time interval TD1 of the input signal IN, a time interval (t4-t5) including the start time td1 of the data time interval TD2 of the input signal IN, and a time interval (t7-t8) including the start time td2 of the data time interval TD3 of the input signal IN.

The third time intervals T3 are set to a time interval (t2-t3), a time interval (t5-t6), and a time interval (t8-t9) where the voltage level of the input signal is kept constant at a Low level or a High level.

When a sum of the consecutive first time interval T1, second time interval T2, and third time interval T3 (=T1+T2+T3) is set to one cycle, one cycle is set to be equal to one data time interval.

The first time interval T1, second time interval T2, and third time interval T3 of one cycle correspond to a standby time interval, a driving time interval, and a holding time interval, respectively, in terms of the functional operation of a level shift circuit.

During the first time interval T1, the switches SW1 and SW2 of the feedback control unit 30 are set to be in an on state and an off state, respectively. For this reason, the control signal S3 from the feedback control unit 30 assumes the voltage level of the complementary output signal OUTB in the first time interval T1.

During the second time interval T2, the switches SW1 and SW2 of the feedback control unit 30 are both turned off. During the second time interval T2, the control signal S3 is held at the voltage level (voltage level of the complementary output signal OUTB) of the control signal S3 in the first time interval T1 immediately before the second time interval T2. A change point of the input signal is set within a time range in the second time interval T2.

During the third time interval T3, the switches SW1 and SW2 of the feedback control unit 30 are set to be in an off state and in an on state, respectively. In the third time interval T3, the control signal S3 assumes the voltage level of an output signal OUT.

Exemplary Embodiment 1-3

FIG. 5 is a diagram showing a specific configuration example in FIG. 2. A second level shifter 20 can be formed of an N-channel MOS transistor M5 as a simple configuration. Referring to FIG. 5, N-channel MOS transistors M1 and M2 and a P-channel MOS transistors M3 and M4 form a first level shifter 10. An input signal IN is supplied to a terminal 1, and a signal INB (complementary input signal of the input signal IN) obtained by inverting the input signal IN by an inverter LINV (that operates on voltages VE3 and VE4) is supplied to a terminal 2. The MOS transistors M1, M2, and M3 in the first level shifter 10 constitute an input section of the level shift circuit, and an MOS transistor M5 of the second level shifter 20 and the MOS transistor M4 of the first level shifter 10 constitute an output section of the level shift circuit. The input section (M1, M2, M3) outputs a first voltage level VE1 or a second voltage level VE2 to a node 3 based on the input signal IN and a potential at a node 6 (for a control signal S3). The MOS transistors M2 and M3 are controlled to be turned on or off in accordance with the control signal S3, and cuts off one of a current path that charges the node 3 or a current path that discharges the node 3.

The output section (MOS transistors M4 and M5) of the level shift circuit outputs an output signal OUT based on a potential at the node 3 and the input signal INB. When the input signal INB is at a High level (VE3) of a low amplitude and the node 3 is at a High level (VE1) of a high amplitude, the MOS transistor M5 is turned on, and the MOS transistor M4 is turned off, thereby driving the output signal OUT to a Low level (VE2) of the high amplitude. When the input signal INB is at a Low level (VE4) of the low amplitude and the node 3 is at a Low level (VE2) of the high amplitude, the MOS transistor M5 is turned off, and the MOS transistor M4 is turned on, thereby driving the output signal OUT to be a High level (VE1) of the high amplitude.

A switch SW1 of a feedback control unit 30 is constituted by a complementary switch including an N-channel MOS transistor SW1N and a P-channel MOS transistor SW1P that receive a complementary signal S1B of a first control signal S1 and the first control signal S1 at gates thereof, respectively, and are controlled to be turned on or off.

The switch SW1 operates to drive the node 3 to the High level (VE1) of the high amplitude and then turn off the MOS transistor M4 in a first time interval T1. Referring to FIG. 5, the complementary switch (SW1N, SW1P) is employed as the switch SW1 so that when a complementary output signal OUTB is at a Low level (VE2) of the high amplitude, the node 6 may be reduced to a second voltage level (VE2) with reliability. This operation is performed in order to turn on the MOS transistor M3 to drive the node 3 to a High level (VE1) and also to turn off the N-channel MOS transistor M2. With this arrangement, even if the input signal IN is set to a High level (VE3) of the low amplitude and the N-channel MOS transistor M1 is turned on, generation of short circuit current can be prevented because the MOS transistor M2 or M3 is turned off.

On the other hand, assume that the switch SW1 is formed of the PMOS pass transistor SW1P alone. Then, when the complementary output signal OUTB is at a Low level (VE2) of the high amplitude, the switch SW1 can only reduce the node 6 to a potential which is higher than the voltage VE2 by the threshold value of the pass transistor SW1P. There is therefore a slight possibility that the N-channel MOS transistor M2 is turned on. Then, when the input signal IN is at the High level (VE3), a slight short circuit current flows between power supplies E1 and E2. When the first time interval T1 is set to be sufficiently short and the short circuit current is sufficiently small, the switch SW1 may be formed of the PMOS pass transistor SW1P alone.

A switch SW2 may be formed of a P-channel pass transistor having a gate to which a second control signal S2 is supplied. In a third time interval T3, the switch SW2 outputs the output signal OUT to the node 6 as the control signal S3. When the output signal OUT is at a Low level (VE2) of the high amplitude, the switch SW2 can only reduce the node 6 to a potential higher than the voltage VE2 by the threshold voltage of the P-channel pass transistor. Thus, there is a slight possibility that the N-channel MOS transistor M2 is turned on. However, when the output signal OUT is at the Low level (VE2), the input signal IN is also at a Low level (VE4), and the N-channel MOS transistor M1 is turned off. No short circuit current is therefore generated.

This level shift circuit performs a dynamic operation when the voltage of the input signal is changed, and performs a static operation when the voltage is stable. The dynamic operation is controlled in a short time, so that no short circuit current is generated.

Figure 6:
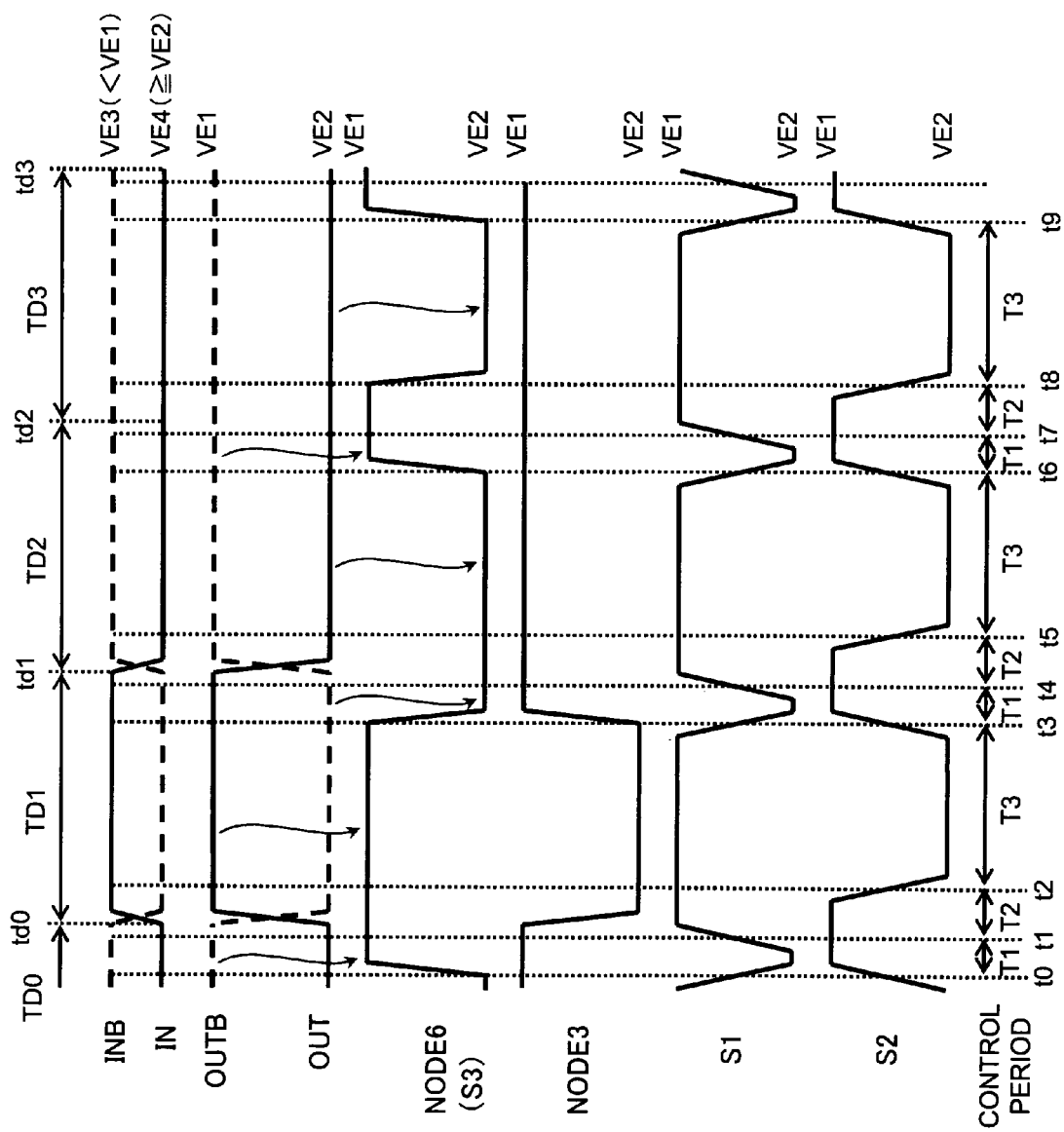
FIG. 6 is a diagram showing a timing operation example of exemplary embodiment 1-3 of the present invention.

FIG. 6 is a diagram showing an operation example of the level shift circuit shown in FIG. 5. FIG. 6 shows an operation when the input signal is a signal such as a data signal that is supplied in a predetermined cycle. FIG. 6 shows control time intervals of the signal IN (indicated by a solid line) and the signal INB (indicated by a broken line) respectively supplied to the terminals 1 and 2 in FIG. 5, the signal OUT (indicated by a solid line) and the signal OUTB (indicated by a broken line) of output terminals 4 and 5, the node 6 (for the signal S3), the node 3, and the signals S1 and S2.

FIG. 6 shows a specific example where switching control of the switches SW1 and SW2 shown in FIG. 4 has been applied to the level shift circuit in FIG. 5. It is assumed that a voltage level relationship is set to VE2≦VE4<VE3<VE1, in which the voltage level VE1 is set to be at a high potential, and the voltage level VE2 is set to be at a low potential.

In four data time intervals TD0, TD1, TD2, and TD3, the input signal IN with an amplitude thereof defined by the voltage levels VE3 and VE4 is set to be at a Low level (VE4) of the low amplitude in the time interval TD0, to be at a High level (VE3) of the low amplitude in the time interval TD1, and to be at a Low level (VE4) of the low amplitude in the time intervals TD2 and TD3. The complementary input signal INB is a reverse phase signal (complementary signal) of the input signal IN.

Referring to FIG. 6, the control signal S1 is set to a Low level (VE2) of the high amplitude in a first time interval T1. At this point, the switch SW1 (SW1P, SW1N) is turned on, and the signal OUTB is transmitted to the node 6. The control signal S1 is set to a High level (VE1) of the high amplitude and the switch SW1 is turned off in a second time interval T2. The control signal S1 is kept High, and the switch SW1 is kept off in a third time interval T3.

The control signal S2 is set to a Low level (VE2) of the high amplitude in the third time interval T3. At this point, the switch SW2 is turned on, so that the signal OUT is transmitted to the node 6. The control signal S2 is set to a High level (VE1) of the high amplitude and the switch SW2 is turned off in the first time interval T1. The control signal S2 is kept High and the switch SW2 is kept off in the second time interval T2.

First, an operation of the level shift circuit in the data time interval TD1 will be described.

The data time interval TD0 which is one data time interval before the data time interval TD1 is set to an initial state. Then, at a time t0 in the initial state, the signals IN and INB are respectively set to a Low level (VE4) of a low amplitude and the High level (VE3) of the low amplitude. The output signal OUT of the output terminal 4 and the complementary output signal OUTB of a node 5 are respectively set to a Low level (VE2) of a high amplitude and the High level (VE1) of the high amplitude. Then, the node 6 and the nod 3 are respectively set to a Low level (VE2) of a high amplitude and the High level (VE1) of the high amplitude.

In the first time interval T1 (time interval from t0 to t1) of the data time interval TD1, the feedback control unit 30 receives the control signal S1 at the Low level (VE2) of the high amplitude. Both of the switches SW1P and SW1N are then turned on to select and output the complementary output signal OUTB. The node 6 (for the control signal S3) is set to a High level (VE1) of the high amplitude. For this reason, the N-channel MOS transistor M2 is turned on, and the P-channel MOS transistor M3 is turned off, in the first level shifter 10. Since the input signal IN is at the Low level (VE4) of the low amplitude in this case, the N-channel MOS transistor M1 is turned off. Accordingly, the node 3 is held at the High level of the high amplitude, and the P-channel MOS transistor M4 is turned off.

The input signal INB is at the High level (VE3) of the low amplitude, so that the N-channel MOS transistor M5 of the second level shifter 20 is turned on. Then, the output terminal 4 is set to a Low level (VE2) of the high amplitude.

In the second time interval T2 (time interval from t1 to t2), the control signals S1 and S2 are both brought to High, the switch SW1 (SW1P, SW1N) and the switch SW2 are both turned off, and the voltage at the node 6 (for the control signal S3) is held at the High level (VE1) of the high amplitude.

At a time td0 in the second time interval T2 (time interval from t1 to t2), the data time interval is switched to the data time interval TD1 from the data time interval TD0. When the input signal IN is changed from the Low level (VE4) of the low amplitude to a High level (VE3), the N-channel MOS transistor M1 of the first level shifter 10 is turned on, thereby reducing the node 3 to a voltage level VE2 (and at this point, the N-channel MOS transistor M2 is turned on). With this arrangement, the P-channel MOS transistor M4 is turned on, and the output terminal 4 is changed (charged) from the Low level (VE2) of the high amplitude to a High level (VE1) of the high amplitude. At this point, due to a change of the input signal IN to the High level (VE3) of the low amplitude, the input signal INB is set to a Low level (VE4) of the low amplitude, so that the N-channel MOS transistor M5 of the second level shifter 20 is turned off.

Even when the amplitude of the input signal IN is small, the N-channel MOS transistor M1 of the first level shifter 10 can quickly pull down the node 3 to turn on the P-channel MOS transistor M4. The output terminal 4 can be thereby driven to the High level (VE1) of the high amplitude at high speed. In this case, the P-channel MOS transistor M3 of the first level shifter 10 is turned off. No short circuit current is therefore generated.

In the third time interval T3 (time interval from t2 to t3), the control signal S1 kept at a High level (VE1) of the high amplitude, and the control signal S2 is set to a Low level (VE2) of the high amplitude. Then, the switch SW1 (SW1P, SW1N) is turned off, and the switch SW2 is turned on. The feedback control unit 30 selects and outputs the signal OUT, and the node 6 (for the control signal S3) is continuously held at the High level (VE1) of the high amplitude, and the N-channel MOS transistor M2 and the P-channel MOS transistor M3 in the first level shifter 10 are kept on and off, respectively. In this case, the input signal IN is kept at the High level (VE3) of the low amplitude. Thus, the N-channel MOS transistor M1 and the P-channel MOS transistor M4 are continuously kept on (with the node 3 kept at the Low level of the high amplitude), and the voltage at the output terminal 4 is stably held at the High level (VE1) of the high amplitude. Accordingly, malfunction of the level shift circuit caused by influence of noise on the voltage level of the output terminal 4 is avoided.

The operation of the level shift circuit in FIG. 5 in the data time interval TD2 will now be described.

In the first time interval T1 (time interval from t3 to t4), the control signal S1 is set to a Low level (VE2) of the high amplitude, and the control signal S2 is set to a High level (VE1) of the high amplitude. In the feedback control unit 30, the switch SW1 (SW1N, SW1P) is turned on, and the switch SW2 is turned off. Then, the complementary output signal OUTB (at the low level) is transmitted to the node 6 (for the control signal S3), so that the node 6 is changed from the High level (VE1) of the high amplitude to a Low level (VE2) of the high amplitude.

With this arrangement, the N-channel MOS transistor M2 and the P-channel MOS transistor M3 in the first level shifter 10 are turned off and on, respectively. The node 3 is therefore driven to a High level (VE1) of the high amplitude, so that the P-channel MOS transistor M4 is turned off.

In the second time interval T2 (time interval from t4 to t5), the control signals S1 and S2 are both brought to a High level of the high amplitude. Then, the switch SW1 (SW1P, SW1N) is turned off, and the switch SW2 is turned off. The node 6 (for the control signal S3) is held at the Low level (VE2) of the high amplitude. The P-channel MOS transistor M3 in the first level shifter 10 is held on, the node 3 is held High, and the P-channel MOS transistor M4 is kept off. The N-channel MOS transistor M2 is kept off.

At a time td1 in the second time interval T2 (time interval from t4 to t5), the data time interval is switched from the data time interval TD1 to the data time interval TD2. Even if the input signal IN is changed from the High level of the low amplitude to a Low level of the low amplitude in this time interval, the node 3 is held High, and the transistor M4 of the first level shifter 10 is kept off.

In this case, due to a change of the input signal IN to a Low level of the low amplitude, the input signal INB is set to a High level of the low amplitude, and the transistor M5 of the second level shifter 20 is turned on. Then, the output terminal 4 is quickly driven to a Low level (VE2) of the high amplitude from the High level (VE1) of the high amplitude. In this case, too, no short circuit current is generated.

In the third time interval T3 (time interval from t5 to t6), the control signal S1 is kept at the High level of the high amplitude, and the control signal S2 is set to a Low level of the high amplitude. Then, the switch SW1 (SW1P, SW1N) is turned off, and the switch SW2 is turned on. Then, the feedback control unit 30 selects and outputs the signal OUT, and the node 6 (for the control signal S3) is continuously kept at the Low level (VE2) of the high amplitude.

The P-channel MOS transistor M4 of the first level shifter 10 is kept off. Since the input signal IN is at the Low level of the low amplitude in this case, the input signal INB is at the High level of the low amplitude. The transistor M5 of the second level shifter 20 is continuously kept on, and the voltage at the output terminal 4 is stably held at the Low level (VE2) of the high amplitude.

When the switch SW2 of the feedback control unit 30 is formed of a PMOS pass transistor, the switch SW2 has only capability of reducing the node 6 to a potential higher than the voltage VE2 by the threshold voltage of the PMOS pass transistor relative to the signal OUT at the Low level (VE2) of the high amplitude, which does not affect the operation of the first level shifter 10, as described above. That is, even if the node 6 has assumed the potential higher than the voltage VE2 by the threshold voltage, the potential at the node 6 is sufficiently low to turn on the P-channel MOS transistor M3, and the P-channel MOS transistor M4 is turned off with reliability. When the output signal OUT is at the Low level (VE2) of the high amplitude, the input signal IN is at the Low level (VE4) of the low amplitude, so that the N-channel MOS transistor MI is turned off. Thus, no short circuit current is generated in the first level shifter 10, and a stable state of the output signal is maintained.

The operation of the level shift circuit in FIG. 5 in the data time interval TD3 will be described in the below.

In the first time interval T1 (time interval from t6 to t7), the control signal S1 is set to a Low level (VE2) of the high amplitude, and the control signal S2 is set to a High level (VE1) of the high amplitude. Then, the switch SW1 (SW1P, SW1N) is turned on, and the switch SW2 is turned off. Then, the feedback control unit 30 selects and outputs the complementary output signal OUTB, and the node 6 (for the control signal S3) is changed from the Low level (VE2) of the high amplitude to a High level (VE1) of the high amplitude. With this arrangement, the N-channel MOS transistor M2 and the P-channel MOS transistor M3 in the first level shifter 10 are turned on and off, respectively. Since the input signal IN is kept at the Low level (VE4) of the low amplitude, the N-channel MOS transistor M1 is kept off. Then, the node 3 is kept at the High level (VE1) of the high amplitude, and the P-channel MOS transistor M4 is kept off.

On the other hand, the complementary signal INB of the input signal IN is kept at the High level of the low amplitude. Thus, the N-channel MOS transistor M5 in the second level shifter 20 is kept on, and the voltage at the output terminal 4 is held at the Low level (VE2) of the high amplitude.

In the second time interval T2 (time interval from t7 to t8), the control signals S1 and S2 are both brought to a High level (VE1) of the high amplitude, and the switches SW1 and SW2 are both turned off. Each of the node 6 (for the control signal S3) and the node 3 is continuously held at the High level (VE1) of the high amplitude.

At a time td2 in the second time interval T2 (time interval from t7 to t8), the data time interval is switched from the data time interval TD2 to the data time interval TD3. At the time td2, the input signal IN is kept at the Low level of the low amplitude, and the N-channel MOS transistor M1 of the first level shifter 10 is kept off. The node 3 remains at the High level (VE1) of the high amplitude, and the P-channel MOS transistor M4 is kept off. The N-channel MOS transistor M5 of the second level shifter 20 is kept on, so that the output terminal 4 is held at the Low level (VE2) of the high amplitude.

In the third time interval T3 (time interval from t8 to t9), the control signal S1 is kept at the High level of the high amplitude, and the control signal S2 is set to a Low level of the high amplitude. Then, the switch SW2 is thereby turned on. The feedback control unit 30 then selects and outputs the signal OUT, and the node 6 (for the control signal S3) is driven from the High level of the high amplitude to a Low level of the high amplitude. The N-channel MOS transistor M1 of the first level shifter 10 is kept off, and the P-channel MOS transistor M3 drives the node 3 to the High level (VE1) of the high amplitude. The P-channel MOS transistor M4 is thereby kept off stably. In this case, the N-channel MOS transistor M5 of the second level shifter 20 is continuously kept on, so that the output terminal 4 is stably held at the Low level (VE2) of the high amplitude.

In the first time interval T1 and the second time interval T2, there is a case where the node 6 is set to a Low level of the high amplitude and the input signal IN is at a High level of the low amplitude. In such a case, the N-channel MOS transistor M5 and the P-channel MOS transistor M4 are both turned off and the output terminal 4 is brought into a high impedance state. In this case, the voltage at the output terminal 4 is held by a parasitic capacitance. Then, the first time interval T1 should be set to be sufficiently short, and the shortest possible time interval necessary for changing the voltage level at the output terminal 4 should be ensured as the second time interval T2.

As described above, in this exemplary embodiment, most of an operation time interval can be set to the third time interval T3. Thus, malfunction of the level shift circuit due to a variation in the voltage level of the output terminal 4 caused by noise or the like is avoided. Further, there is no short circuit current, and lower power dissipation can be implemented. Moreover, even if the amplitude of the input signal IN is small, at least one of the P-channel MOS transistor M4 of the first level shifter 10 and the N-channel MOS transistor M5 of the second level shifter 20 is turned off. Thus, a high-speed level shift operation is possible. Further, even if the connecting order of the N-channel MOS transistors M1 and M2 of the first level shifter 10 is interchanged, a similar level shift operation is possible.

A rise or fall speed of each of the control signals S1 and S2 is not related to the operating speed of the level shift circuit, and timings of the control signals S1 and S2 do not need to be exact. Thus, a control signal generation circuit 90 that generates the control signals S1 and S2 can be implemented by a simple circuit.

Exemplary Embodiment 1-4

Figure 7:
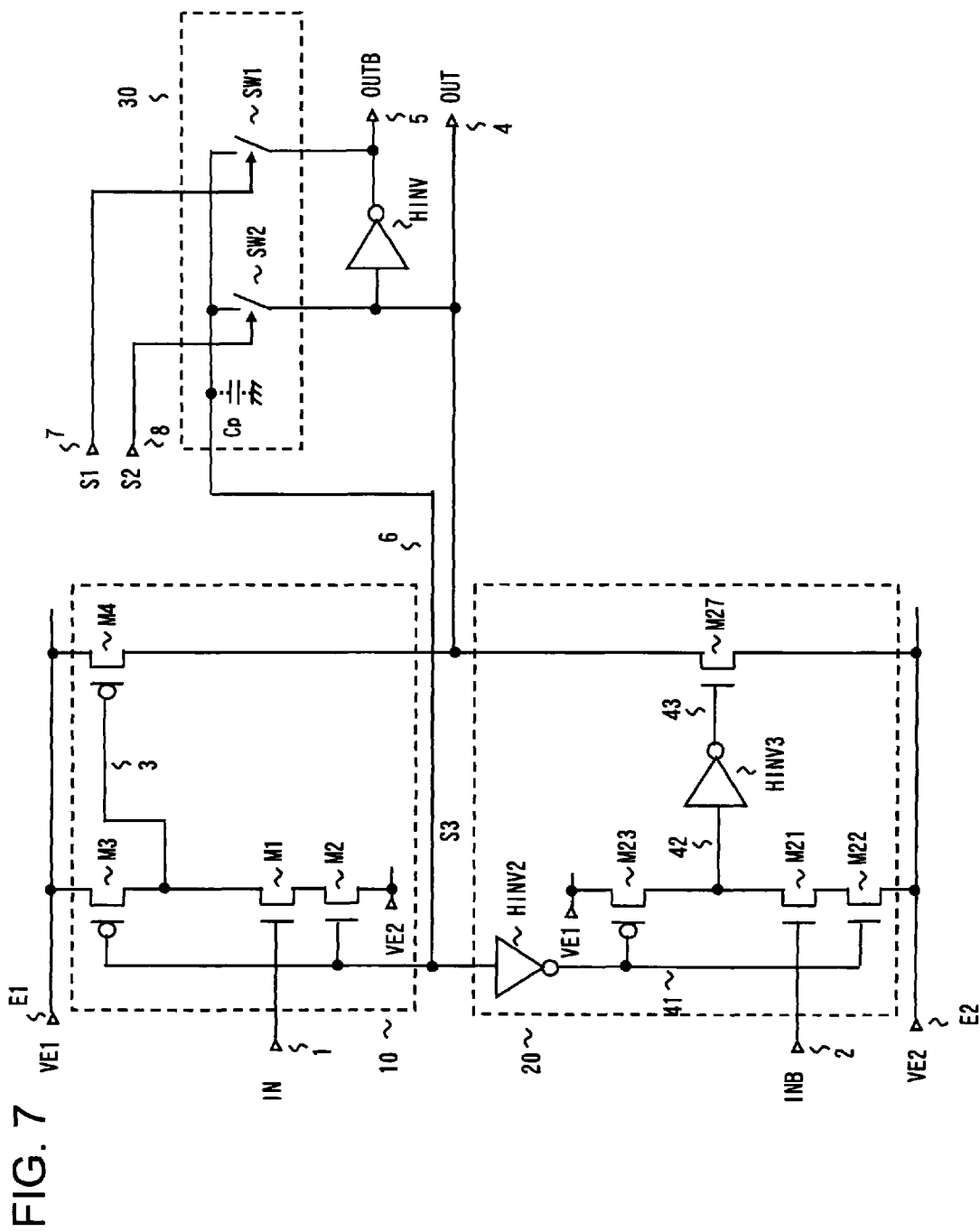
FIG. 7 is a diagram showing a configuration of exemplary embodiment 1-4 of the present invention.

FIG. 7 is a diagram showing a configuration of another exemplary embodiment of the present invention. This exemplary embodiment is inferior to the above-mentioned exemplary embodiments in terms of area saving. However, this exemplary embodiment has a configuration in which a control signal S3 from a feedback control unit 30 is supplied to both of a first level shifter 10 and a second level shifter 20, thereby controlling activation and deactivation. A high-speed operation can be thereby implemented. Since configurations of the first level shifter 10 and the feedback control unit 30 are similar to those in FIG. 2, descriptions of the configurations will be omitted.

The second level shift circuit 20 includes an N-channel MOS transistor M22 with a source thereof connected to a second power supply terminal (E2) and a gate thereof connected to an output node 41 of an inverter HINV2 that inverts a potential at a node 6, an N-channel MOS transistor M21 whose source is connected to a drain of the N-channel MOS transistor M22 and whose gate is connected to a terminal 2 and which receives an inverted signal INB of an input signal IN, a P-channel MOS transistor M23 with a source thereof connected to a first power supply terminal (E1), a drain thereof connected to a drain of the N-channel MOS transistor M21, and a gate thereof connected to the output node 41 of the inverter HINV2 that inverts the potential at the node 6, an inverter HINV3 that inverts a potential at a connecting node 42 between the drain of the P-channel MOS transistor M23 and the drain of the N-channel MOS transistor 21, and an N-channel MOS transistor M27 with a source thereof connected to the power supply terminal E2, a gate thereof connected to an output node 43 of the inverter HINV3, and a drain thereof connected to an output terminal 4. An input and an output of each of an inverter HINV and the inverters HINV2 and HINV3 are set to have high amplitudes (with levels of VE1 and VE2). Preferably, switches SW1 and SW2 in FIG. 7 are each formed of a complementary switch.

Figure 8:
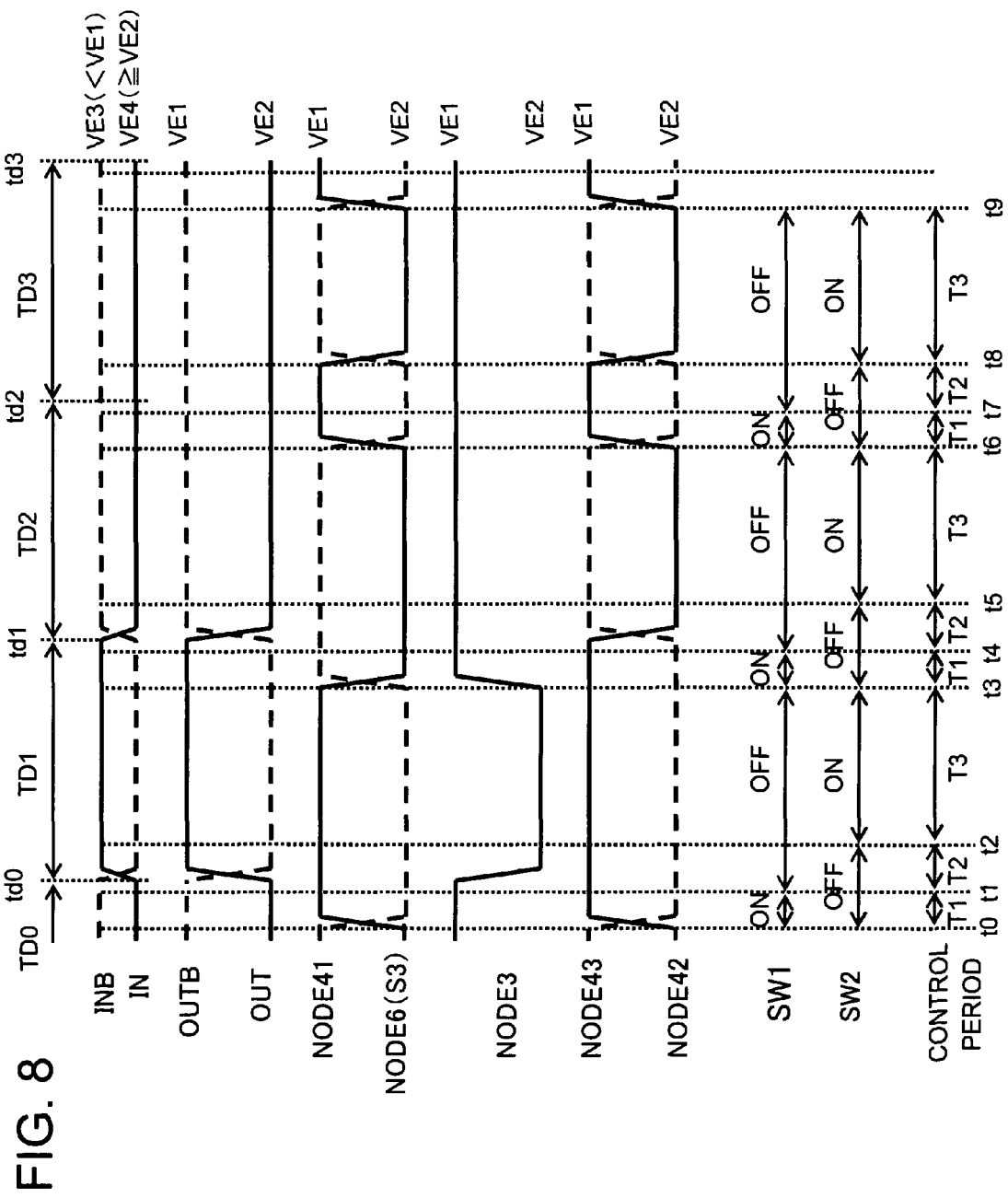
FIG. 8 is a diagram showing a timing operation example of exemplary embodiment 1-4 of the present invention.

FIG. 8 is a diagram showing control timings in FIG. 7. FIG. 8 shows voltage waveforms of the signal IN (indicated by a solid line) and the inverted signal INB (indicated by a broken line), an output signal OUT (indicated by a solid line) and an inverted signal OUTB of the output signal OUT (indicated by a broken line), the node 6 (indicated by a solid line), the node 41 (indicated by a broken line), a node 3, the node 42 (indicated by a solid line), and the node 43 (indicated by a broken line), turning on or off of the switches SW1 and SW2, and control time intervals T1, T2, and T3. A voltage level relationship is set to VE2≦VE4<VE3<VE1, in which the voltage VE1 is set to be at a high potential, and the voltage VE2 is set to be at a low potential.

In four data time intervals TD0, TD1, TD2, and TD3, the input signal IN with an amplitude thereof defined by voltages VE3 and VE4 is set to be at a Low level (VE4) in the data time interval TD0, at a High level (VE3) of a low amplitude in the time interval TD1, and at a Low level (VE4) in the time intervals TD2 and TD3. The complementary input signal INB is a complementary signal of the input signal IN.

Referring to FIG. 8, the switch SW1 is turned on by a control signal S1 in a first time interval T1, and the signal OUTB is transmitted to the node 6. In a third time interval T3, the switch SW2 is turned on by a control signal S2, and the signal OUT is transmitted to the node 6.

First, an operation of the level shift circuit in FIG. 7 in the data time interval TD1 will be described.

The data time interval TD0 which is one data time interval earlier than the data time interval TD1 is set to an initial state. At a time t0 in the initial state, the signals IN and INB are respectively set to a LOW level (VE4) of the low amplitude and a High level (VE3) of the low amplitude. The output signal OUT of the output terminal 4 and the complementary output signal OUTB at a node 5 are respectively set to a Low level (VE2) of a high amplitude and a High level (VE1) of the high amplitude. Further, the node 6, the node 3, the node 41, the node 42, and the node 43 are respectively set to Low, High, High, Low, and High levels of the high amplitude.

In the first time interval T1 (time interval from t0 to t1) of the data time interval TD1, the switch SW1 and the switch SW2 of the feedback control unit 30 are turned on and off, respectively. The feedback control unit 30 then selects and outputs the signal OUTB. The node 6 (for the control signal S3) is set to a High level (VE1) of the high amplitude, and the node 41 is set to a Low level of the high amplitude. In the first level shifter 10, an N-channel MOS transistor M2 is turned on, and a P-channel MOS transistor M3 is turned off. Since the input signal IN is at the Low level of the low amplitude in this case, an N-channel MOS transistor M1 is turned off. For this reason, the node 3 is held at the High level of the high amplitude, and a P-channel MOS transistor M4 is turned off. In the second level shifter 20, the N-channel MOS transistor M22 is turned off, and the P-channel MOS transistor M23 is turned on. The node 42 is thereby driven to a High potential of the high amplitude, the node 43 is set to a Low level of the high amplitude, and the N-channel MOS transistor M27 is turned off. Since the input signal IN is at the Low level of the low amplitude in this case, the N-channel MOS transistor M1 is kept off. That is, the output transistor M4 of the first level shifter 10 and the output transistor M27 of the second level shifter are both turned off, and the output node 4 is maintained at the Low level (VE2) of the high amplitude.

In the second time interval T2 (time interval from t1 to t2), the switches SW1 and SW2 are turned off, and the node 6 (for the control signal S3) is held at the High level (VE1) of the high amplitude.

At a time td0 in the second time interval T2 (time interval from t1 to t2), the data time interval is switched from the data time interval TD0 to the data time interval TD1. When the input signal IN is changed from the Low level (VE4) of the low amplitude to a High level (VE3) of the low amplitude, the N-channel MOS transistor M1 of the first level shifter 10 is turned on, and the potential at the node 3 is thereby pulled down to a Low level (VE2) (and at this point, the N-channel MOS transistor M2 is also turned on). With this arrangement, the P-channel MOS transistor M4 is turned on, and the voltage at the output terminal 4 is changed (charged) from the Low level (VE2) of the high amplitude to a High level (VE1) of the high amplitude. At this point, the node 6 is held at the High level of the high amplitude. Then, in the second level shifter 20, the node 41 is at the Low level of the high amplitude, the node 42 is at the High level, and the node 43 is at the Low level. Thus, the N-channel MOS transistor M27 is turned off. That is, an operation (level shift operation) of charging the output terminal 4 to the High level (VE1) of the high amplitude is performed by the first level shifter 10, with the second level shifter 20 deactivated.

Even if the amplitude of the input signal IN is small, the N-channel MOS transistor M1 of the first level shifter 10 can quickly pull down the potential at the node 3, and can drive the output terminal 4 to the High level (VE1) of the high amplitude at high speed. Further, no short circuit current is generated.

In the third time interval T3 (time interval from t2 to t3), the switch SW1 is turned off, and the switch SW2 is turned on. Then, the feedback control unit 30 selects and outputs the signal OUT. The node 6 (for the control signal S3) is continuously held at the High level (VE1) of the high amplitude, and the transistors M2 and M3 of the first level shifter 10 are also kept on and off, respectively. In this case, the -input signal IN is at the High level (VE4) of the low amplitude. Thus, the N-channel MOS transistor M1 and the P-channel MOS transistor M4 of the first level shifter 10 are continuously kept on, and the output terminal 4 is stably held at the High level (VE1) of the high amplitude. In this case, in the second level shifter 20, the node 41 is at the Low level of the high amplitude, the node 42 is at the High level of the high amplitude, and the node 43 is at the Low level of the high amplitude. Thus, the N-channel MOS transistor M27 is turned off, and the second level shifter 20 is deactivated. Accordingly, malfunction of the level shift circuit due to influence of noise or the like on the voltage level of the output terminal 4 is avoided.

The operation of the level shift circuit in FIG. 7 in the data time interval TD2 will be described in the below.

In the first time interval T1 (time interval from t3 to t4), the switch SW1 is turned on, and the switch SW2 is turned off in the feedback control unit 30. The signal OUTB (at the Low level) is transmitted to the node 6 (for the control signal S3), and the node 6 is changed from the High level (VE1) of the high amplitude to a Low level (VE2) of the high amplitude. With this arrangement, the N-channel MOS transistor M2 and the P-channel MOS transistor M3 in the first level shifter 10 are turned off and on, respectively. The node 3 is thereby raised to a High level (VE1) of the high amplitude, and the P-channel MOS transistor M4 is turned off. The node 6 is set to a Low level (VE2) of the high amplitude. The node 41 of the second level shifter 20 is set to a High level of the high amplitude. The P-channel MOS transistor M23 is turned off, and the N-channel MOS transistor M22 is turned on. In this case, the complementary input signal INB is at the Low level (VE4) of the low amplitude, the N-channel MOS transistor M21 is kept off, the node 42 is held at the High level (VE2) of the high amplitude, and the N-channel MOS transistor M27 is kept off. That is, the output transistor M4 of the first level shifter 10 and the output transistor M27 of the second level shifter 20 are both brought into off states. Then, the output node 4 is maintained at the High level (VE1) of the high amplitude.

In the second time interval T2 (time interval from t4 to t5), the switch SW1 is turned off, the switch SW2 is turned off, and the node 6 (for the control signal S3) and the node 41 are respectively held at the Low level (VE2) of the high amplitude and the High level (VE1) of the high amplitude. The P-channel MOS transistor M3 of the first level shifter 10 is held on, the node 3 is held at the High level of the high amplitude, and the P-channel MOS transistor M4 is kept off. A state of each transistor in the second level shifter 20 is also maintained.

At a time td1 in the second time interval T2 (time interval from t4 to t5), the data time interval is switched from the data time interval TD1 to the data time interval TD2. Even if the input signal IN is changed from the High level of the low amplitude to a Low level of the low amplitude, the transistor M4 in the first level shifter 10 is kept off.

At this point, due to the change of the input signal IN to the Low level of the low amplitude, the input signal INB is set to a High level of the low amplitude. In the second level shifter 20, the NMOS transistor M21 is thereby turned on. Then, the node 42 is set to a Low level of the high amplitude, and the node 43 is set to a High level of the high amplitude. Then, the NMOS transistor M27 is turned on, and the output terminal 4 is thereby driven to a Low level (VE2) of the high amplitude. When the second level shifter 20 is activated, the first level shifter 10 is deactivated (with the transistor M4 turned off). For this reason, the output terminal 4 is quickly driven from the High level (VE1) of the high amplitude to the Low level (VE2) of the high amplitude. No short circuit current is generated in this case as well.

In the third time time interval T3 (time interval from t5 to t6), the switch SW1 is turned off, and the switch SW2 is turned on. The feedback control unit 30 therefore selects and outputs the signal OUT. The node 6 (for the control signal S3) is continuously kept at the Low level (VE2) of the high amplitude.

The P-channel MOS transistor M4 in the first level shifter 10 is kept off (which means that the first level shifter 10 is deactivated). In this case, the input signal IN is at the Low level of the low amplitude (and the input signal INB is at the High level). Thus, the NMOS transistor M21 of the second level shifter 20 is continuously kept on, the node 42 is kept at the Low level of the high amplitude, the node 43 is kept at the High level of the high amplitude, the N-channel MOS transistor M27 is kept on, and the output terminal 4 is stably held at the Low level (VE2) of the high amplitude.

The operation of the level shift circuit in FIG. 7 in the data time interval TD3 will be described.

In the first time interval T1 (time interval t6 to t7), the switch SW1 is turned on, and the switch SW2 is turned off. Then, the feedback control unit 30 selects and outputs the signal OUTB, and the node 6 (for the control signal S3) is changed from the Low level (VE2) of the high amplitude to a High level (VE1) of the high amplitude. With this arrangement, the N-channel MOS transistor M2 and the P-channel MOS transistor M3 in the first level shifter 10 are turned on and off, respectively. In this case, the input signal IN is at the Low level of the low amplitude. Thus, the N-channel MOS transistor M1 is kept off, the node 3 is kept at the High level (VE1) of the high amplitude, and the P-channel MOS transistor M4 is also kept off. Further, the signal INB is kept at the High level of the low amplitude, and in the second level shifter 20, the node 41 is set to a Low level, the NMOS transistor M22 is turned off, the PMOS transistor M23 is turned on, the node 42 is set to a High level, the node 43 is set to a Low level, and the N-channel MOS transistor 27 is turned off. That is, the output transistor M4 of the first level shifter 10 and the output transistor M27 of the second level shifter 20 are both brought into off states.

In the second time interval T2 (time interval from t7 to t8), the switches SW1 and SW2 are both turned off, and the node 6 (for the control signal S3) is held at the High level (VE1) of the high amplitude. At a time td2 in the second time interval T2 (time interval t7 to t8), the data time interval is switched from the data time interval TD2 to the data time interval TD3. At the time td2, the input signal IN is kept at the Low level of the low amplitude, and the NMOS transistor M1 and the P-channel MOS transistor M4 in the first level shifter 10 are kept off. In the second level shifter 20, the node 41, 42, and 43 are respectively kept Low, High, and Low, and the PMOS transistor M23 is kept on, the NMOS transistor M22 is kept off, and the NMOS transistor M27 is kept off. That is, the output transistor M4 of the first level shifter 10, and the output transistor M27 of the second level shifter 20 are both kept off.

In the third time interval T3 (time interval from t8 to t9), the switch SW1 is turned off, and the switch SW2 is turned on. Then, the feedback control unit 30 selects and outputs the signal OUT, and the node 6 (for the control signal S3) is set to a Low level (VE2) of the high amplitude. In the first level shifter 10, the PMOS transistor M3 is turned on, and the NMOS transistor M2 is turned off. The node 3 is kept at the High level of the high amplitude, and the P-channel MOS transistor M4 is kept off. In the second level shifter 20, the node 41 is set to a High level of the high amplitude, the NMOS transistor M22 is turned on, and the PMOS transistor M23 is turned off. The signal INB is kept at the High level of the low amplitude. Then, the NMOS transistor M21 is kept on, the node 42 is set to a Low level of the high amplitude, the node 43 is set to a High level of the high amplitude, the N-channel MOS transistor M27 is turned on, and the output terminal 4 is kept at the Low level (VE2) of the high amplitude.

In the first time interval T1 and the second time interval T2, there is a case where the node 6 is at the High level (VE1) of the high amplitude and the input signal IN is at the Low level (VE4) of the low amplitude, as in the time interval (from t6 to t8). In such a case, the N-channel MOS transistor M27 and the P-channel MOS transistor M4 are both brought into off states and the output terminal 4 is brought into a high impedance state. In this case, the potential at the output terminal 4 is held by a parasitic capacitance. Then, the first time interval T1 and the second time interval T2 should be set to be sufficiently short, and the shortest possible time interval necessary for changing the voltage level at the output terminal 4 should be ensured as the second time interval T2.

In this exemplary embodiment, most of an operation time interval can be set to the third time interval T3. Thus, malfunction of the level shift circuit due to a variation in the potential at the output terminal 4 caused by noise or the like is avoided. Further, since there is no short circuit current generated, lower power dissipation can be implemented. Moreover, even if the amplitude of the input signal IN is small, at least one of the transistor M4 of the first level shifter 10 and the transistor M27 of the second level shifter 20 is turned off. Thus, a high-speed level shift operation is possible. Since a rise or fall speed of each of the control signals S1 and S2 is not related to the operating speed of the level shift circuit, and timings of the control signals S1 and S2 do not need to be exact, a control signal generation circuit 90 that generates the control signals S1 and S2 can be implemented by a simple circuit.

In this exemplary embodiment, even if the inverter HINV2 of the second level shifter 20 is replaced by a third switch connected between the output terminal 4 and the node 41 and controlled to be turned on or off by the control signal S1 and a fourth switch connected between a complementary output terminal 5 and the node 41 and controlled to be turned on or off by the control signal S2, a similar operation can be implemented.

Exemplary Embodiment 2

Figure 9:
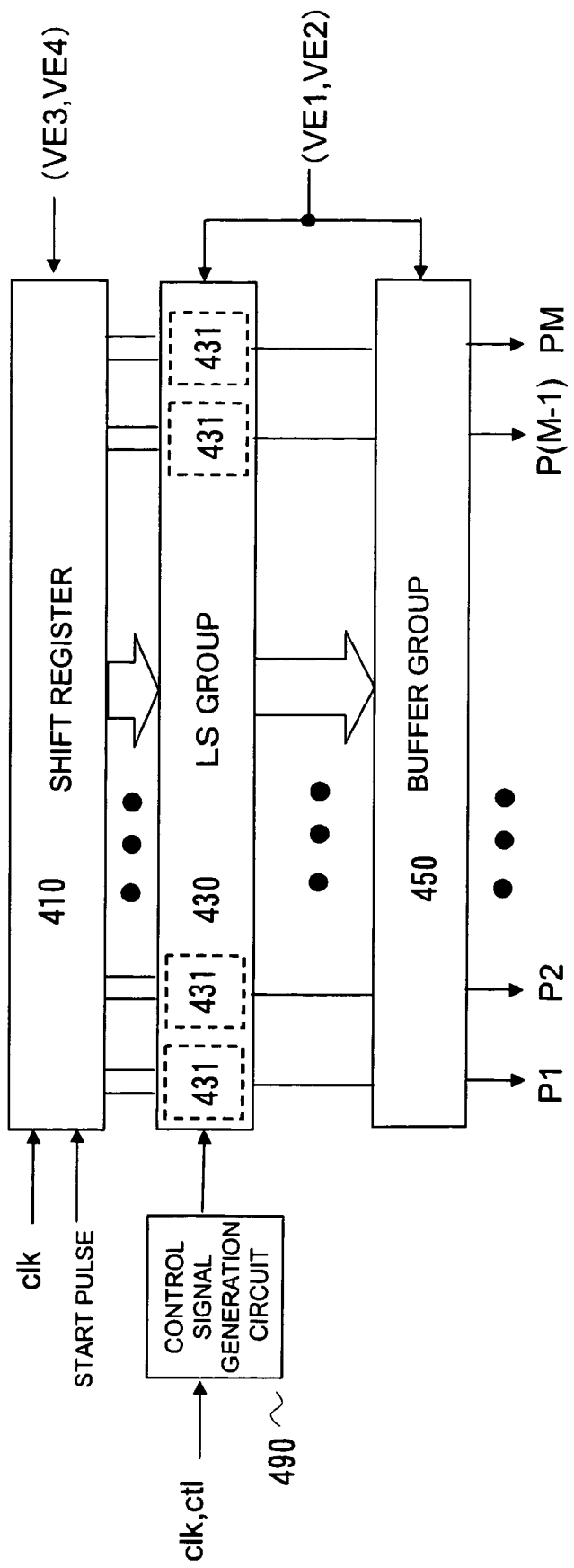
FIG. 9 is a diagram showing a configuration example of a row driver in exemplary embodiment 2 of the present invention.

FIG. 9 is a diagram showing an exemplary embodiment of a configuration of a row driver (scan driver) of a display system of the present invention. FIG. 9 shows an example where the present invention has been applied to a multiple output driver. Referring to FIG. 9, this row driver includes a shift register 410 that transfers a start pulse to a subsequent stage based on a clock signal clk, a level shift circuit group (LS group) 430 including a plurality of level shift circuits 431 that differentially receive respective output signals (scan signals) of respective stages of the shift register 410 and perform level shifting, a buffer group 450 including a plurality of buffers, each of which receives a high-amplitude output signal of a corresponding one of the level shift circuits 431 at a single end and outputs a scan signal to a corresponding one of scan lines (scan lines) P1, P2, . . . PM, and a control signal generation circuit 490 that receives a low-amplitude signal clk (clock) and a signal ctl (timing control signal), and outputs high-amplitude control signals S1 and S2 (corresponding to the control signals S1 and S2 in FIG. 1) to each of the level shift circuits 431. Each level shift circuit 431 is provided corresponding to each stage of the shift register 410. The shift register 410 is driven by power supply voltages (VE3, VE4), and the level shift circuits 430 and the buffers 450 are driven by power supply voltages (VE1, VE2).

The configuration shown in FIG. 9 uses the level shift circuit described in each of the exemplary embodiments 1-1 through 1-4 as the level shift (LS) circuit 431. The control signals S1 and S2 from the control signal generation circuit 490 correspond to the high-amplitude control signals S1 and S2 respectively supplied to the switches SW1 and SW2 (refer to FIGS. 1, 2, 3, 5, and 6) of the feedback control unit 30 in the level shift circuit described in each of the exemplary embodiments 1-1 through 1-4. The control signal generation circuit 490 outputs the control signals S1 and S2 in common to the respective level shift circuits 431. As described above, a rise or fall speed of the voltage level of each of the control signals S1 and S2 does not affect the operating speed of each level shift circuit 431. By applying the level shift circuit of the present invention, a scan driver that operates at high speed with lower power dissipation can be implemented, and cost reduction due to area saving can also be implemented.

Exemplary Embodiment 3

Figure 10:
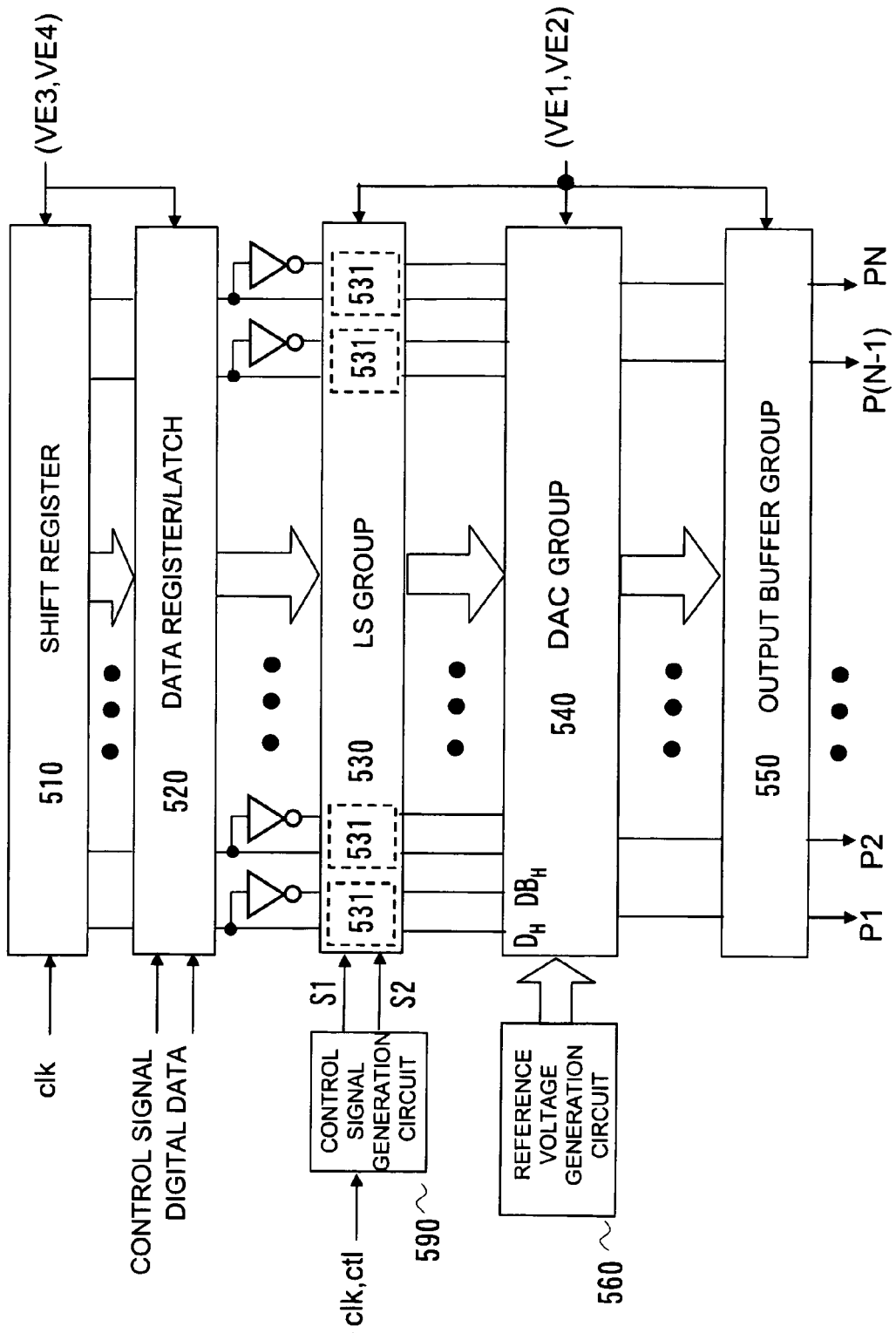
FIG. 10 is a diagram showing a configuration example of a column driver in exemplary embodiment 3 of the present invention.

FIG. 10 is a diagram showing an exemplary embodiment of a configuration of a data driver in a display system of the present invention. FIG. 10 shows an example where the present invention has been applied to a level shift circuit of a multiple output driver. Referring to FIG. 10, the data driver includes a shift register 510 that receives a clock signal clk and generates a latch timing signal that performs latch address selection, a data register/latch 520 that latches digital data based on an output (latch timing signal) of the shift register 510, a level shift circuit group (LS group) 530 including a plurality of level shift circuits 531 that differentially receive output data signals in respective stages of the data register latch 520 and perform level shifting, a DAC group 540 including a plurality of digital-to-analog converters (DACs), each of which respectively receive a predetermined number of output signals constituting video data from the associated level shift circuits 531 and reference voltages that have mutually different levels from a reference voltage generation circuit 560 and output gray scale voltages corresponding to the video data, a output buffer group 550 including a plurality of output buffers, each of which receives an output voltage of an associated digital-to-analog converter of the DAC group 540 and drives an associated data line, and a control signal generation circuit 590 that receives a low-amplitude signal clk (clock) and a signal ctl (timing control signal) and supplies high-amplitude control signal S1 and S2 (corresponding to the control signals S1 and S2 in FIG. 1 or the like) to each of the level shift circuits 531. The shift register 510 and the data register/latch 520 are driven by supply voltages (VE3, VE4). The level shift circuits 530, digital-to-analog converters (DAC), and output buffers 550 are driven by supply voltages (VE1, VE2). In the LS group 530, there are provided a predetermined number of level shift circuits 531 having outputs thereof connected to one associated DAC provided in the DAC group 540, wherein the predetermined number corresponds to the number less than or equal to the bit number of the one item of video data. The predetermined number of level shift circuits 531 connected to one associated DAC may perform level shift operation of the entire bits of the one item of video data in parallel. Alternatively, the level shift circuits 531 connected to one associated DAC may perform level shift operation of only a part of the one item of video data in one cycle and performs several times of level shifting successively in a time division manner to complete the level shifting the entire bits of the one item of video data.

In the configuration shown in FIG. 10, the level shift (LS) circuits 531 differentially receive the outputs of the data register/latch 520 and differentially output the output signals. The level shift circuit described with reference to FIG. 1 or 2, for example, is employed as the level shift (LS) circuit 531. The control signals SI and S2 from the control signal generation circuit 590 respectively correspond to the high-amplitude control signals S1 and S2 respectively supplied to the switches SW1 and SW2 of the feedback control unit 30 (refer to FIG. 1 or 2, or the like, for example). The control signal generation circuit 590 outputs the control signals S1 and S2 in common to the respective level shift circuits 531. A rise or fall speed of the voltage level of each of the control signals S1 and S2 does not affect the operating speed of each level shift circuit 531. By applying the level shift circuit of the present invention, the data driver that operates at high speed with lower power dissipation can be implemented. Cost reduction due to area saving can also be implemented.

Exemplary Embodiment 4

Figure 11:
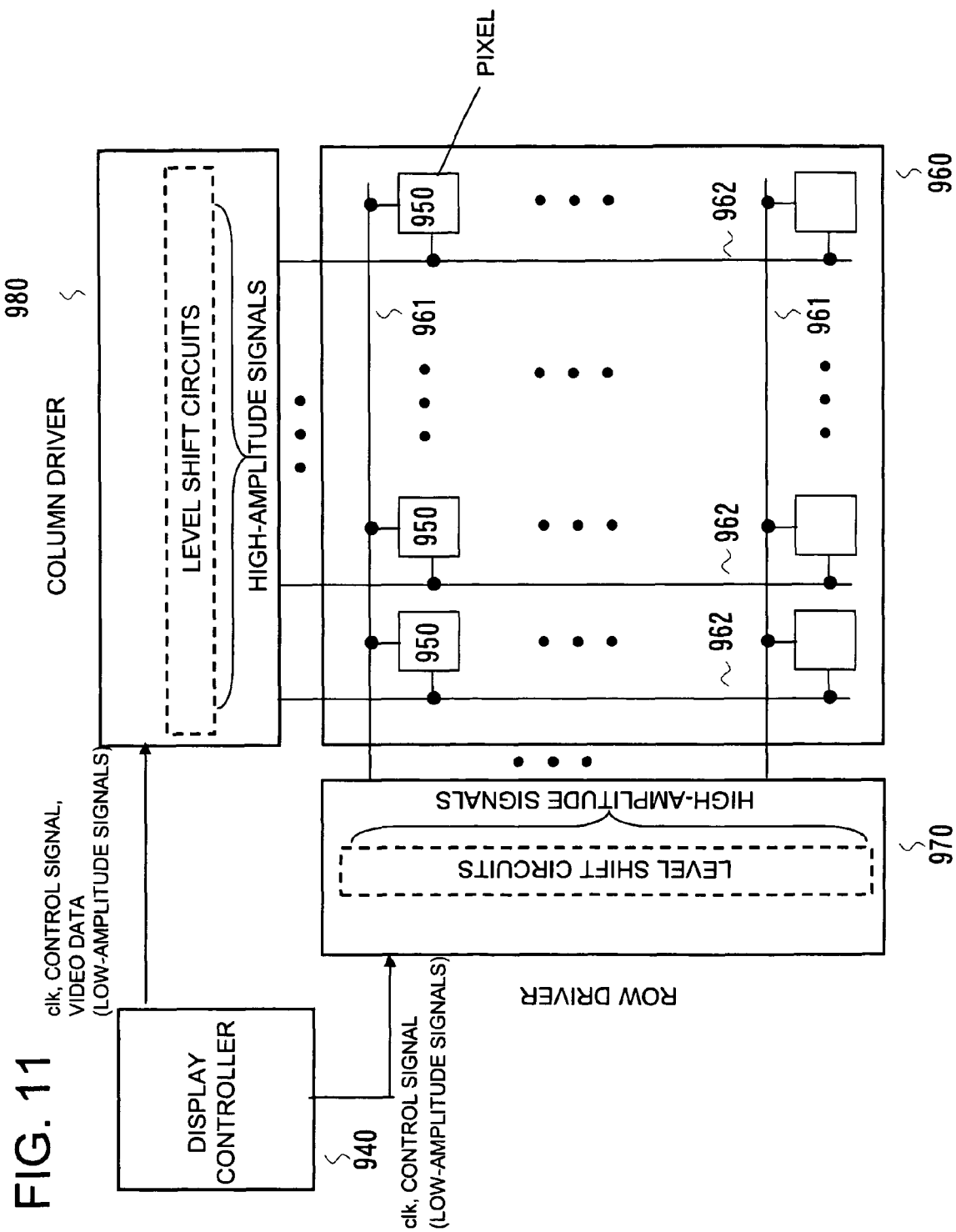
FIG. 11 is a diagram showing a configuration example of a display system in exemplary embodiment 4 of the present invention.

FIG. 11 is a diagram showing a configuration example of a display system of the present invention. Referring to FIG. 11, in the display system in an active matrix driven system, a display unit 960 is formed of a structure including a semiconductor substrate with a plurality of pixels 950 arranged thereon in a matrix form, an opposing substrate with one transparent electrode formed on an entire surface thereof, and a display element sealed between the two substrates that are opposed to each other. On the semiconductor substrate, data lines 962 that send a plurality of level voltages (gray scale voltages) to be applied respective electrodes of the pixels and scan lines 961 that send scan signals are wired in a lattice form. A pixel 950 is arranged in a mutual intersection between each scan line (scan electrode line) 961 and each data line (data electrode line) 962. In the case of the display system in a passive matrix driven system, a display unit 960 is formed of a structure in which a substrate with data lines 962 that send a plurality of level voltages (gray scale voltages) wired thereon and a substrate with scan lines 961 that send scan signals wired thereon are opposed, and a display element is sealed between the substrates. A region in which each data line 962 and each scan line 961 intersect constitutes a pixel 950.

In the case of the display system in the active matrix driven system, according to a scan signal on each scan line 961, turning on/off of a switch (TFT) of the pixel 950 is controlled. When the pixel switch is turned on, a video signal (gray scale voltage corresponding to the video signal) on the data line 962 to which the pixel 950 is connected is applied to the electrode of the pixel, thereby displaying an image.

The scan signal is supplied to the corresponding scan line 961 from a row (scan) driver 970 and supply of the gray scale voltage to each pixel is performed from a column (data) driver 980 via the corresponding data line 962.

Data rewriting of one screen is usually performed in one frame time interval (usually 1/60 seconds). Using each scan line, every pixel line (every line) is selected one by one, and within a selected period, the gray scale voltage is supplied through each data line. A display controller 940 supplies a clock signal, a control signal (start pulse), and the like to the row driver 970, and supplies a clock clk, a control signal, and video data (low-amplitude digital signals) to the column driver 980.

As described with reference to FIGS. 9 and 10, the display system in this exemplary embodiment includes the level shift circuit of the present invention as each of the row driver 970 and the column driver 980, and the level shift circuit outputs a high-amplitude signal.

Figure 12C:
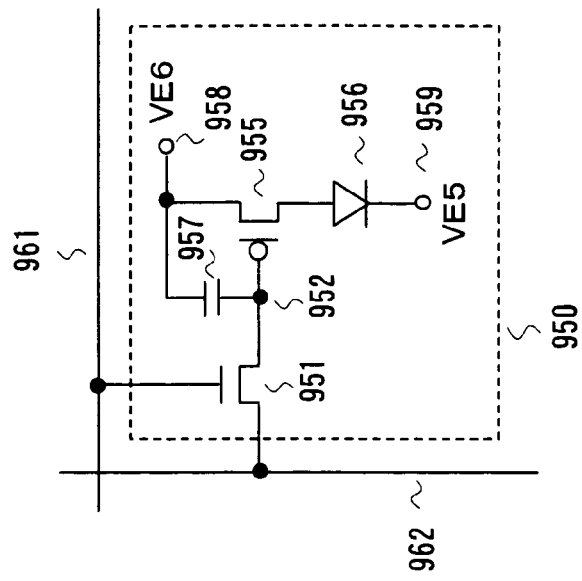
FIGS. 12A to 12C are diagrams showing an example of a pixel in FIG. 11.
Figure 12B:
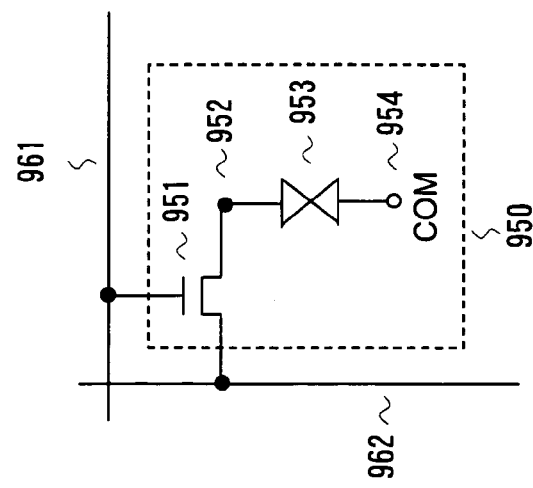
Figure 12A:
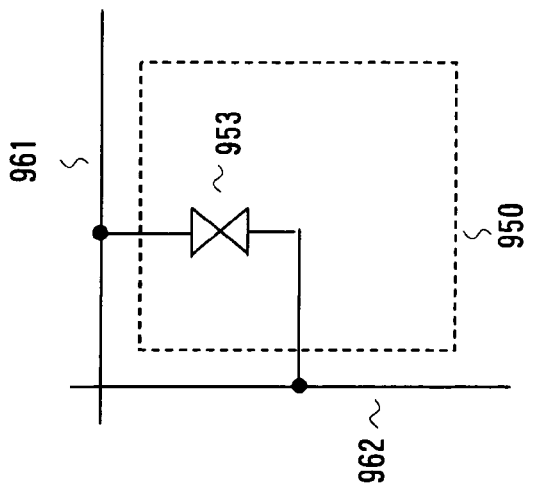
Figure 13:
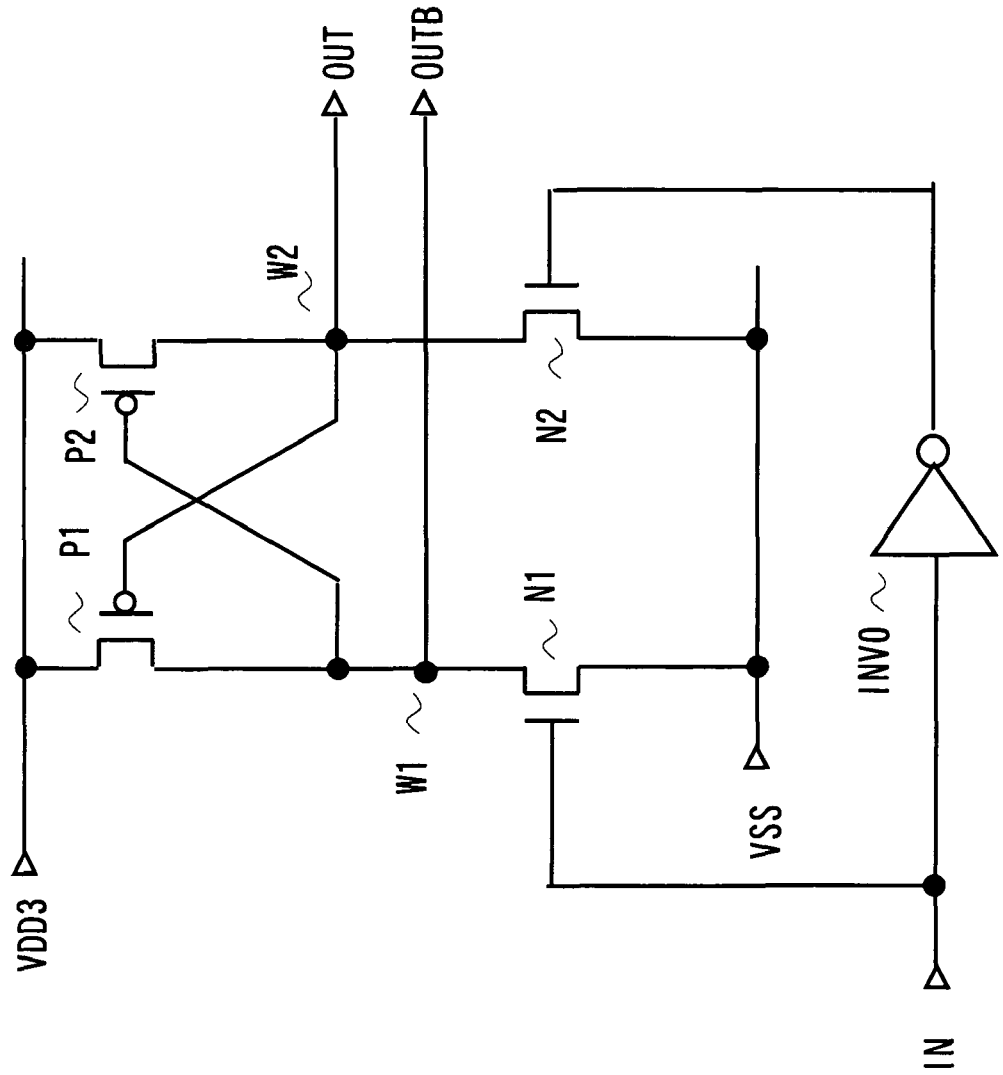
FIG. 13 is a diagram showing a configuration of a level shift circuit in a prior art.
Figure 14:
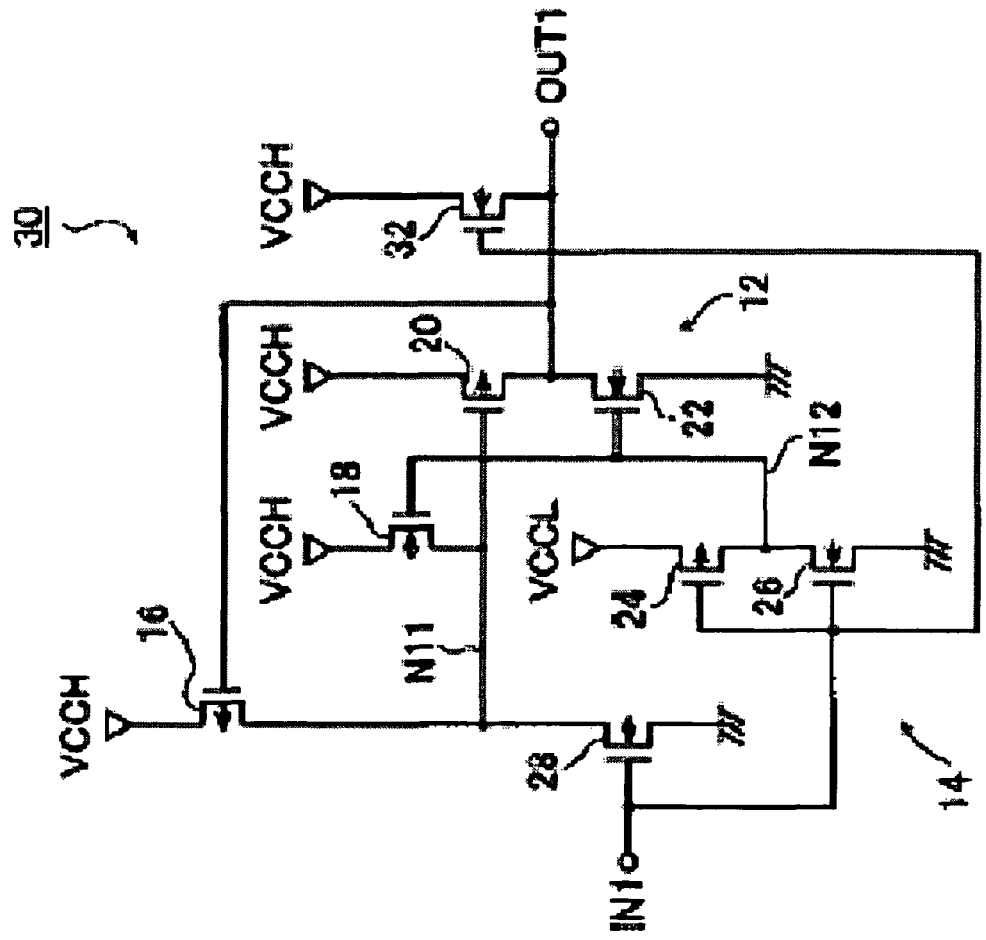
FIG. 14 is a diagram showing a configuration of a level shift circuit in a prior art.

FIGS. 12A to 12C include diagrams each showing an example of the pixel 950 in FIG. 11. FIG. 12A schematically shows a configuration of the pixel 950 in a liquid crystal unit of a passive matrix type. Transmittance of a liquid crystal element 953 sandwiched between an intersection of a scan electrode line 961 and a data electrode line 962 changes in accordance with a difference of voltages applied to the scan electrode line 961 and the corresponding data electrode line 962, and causes back light (or reflected light) to pass therethrough. FIG. 12B shows a configuration of the pixel 950 in a liquid crystal unit of an active matrix type. A gate of a pixel switch (TFT) 951 is connected to the scan line 961. One of a drain and a source of the pixel switch (TFT) 951 is connected to the corresponding data line 962. The other of the drain and the source of the pixel switch (TFT) 951 is connected to a pixel electrode 962. A liquid crystal element 953 is sandwiched between the pixel electrode 952 and an opposing transparent electrode 954. When the scan line 961 is at a high potential and the pixel switch (TFT) 951 is turned on, the gray scale voltage on the corresponding data line 962 is applied to the pixel electrode 952. Transmittance of the liquid crystal element 953 changes according to a potential difference between the pixel electrode 952 and the opposing electrode 954, thereby causing back light (or reflected light) to pass through the liquid crystal element. FIG. 12C is a diagram showing a configuration of the pixel 950 (in a current driving system) in an organic EL (Electro Luminescence) display unit of the active matrix type. The pixel 950 is of a current driven type. A gate of a pixel switch (TFT) 951 is connected to the scanning line 961. One of a drain and a source of the pixel switch (TFT) 951 is connected to the corresponding data line 962. The other of the drain and the source of the pixel switch (TFT) is connected to a gate of an organic EL element driving transistor (P-channel TFT transistor) 955. A source of the driving transistor 955 is connected to a power supply 958. A drain of the driving transistor 955 is connected to an EL element 956. A capacitance 957 for data signal holding is connected between the source and the gate of the driving transistor 955. When the scan line 961 is at a high potential, the pixel switch (TFT) 951 is turned on. The gray scale voltage on the corresponding data line is applied to the gate of the driving transistor 955 and the capacitance 957, thereby flowing current through the organic EL element 956. The organic EL element 956 thereby emits light.

According to the exemplary embodiments described above, even if an input signal is of a low amplitude, a high-speed level shift operation can be performed. Level shifting to an output signal of a large amplitude that is equal to or more than several times the amplitude of the input signal, for example, can also be implemented. Further, discharging and charging operations are not generated at the same time on a same current path. Thus, short circuit current generation at a time of a change in an output is prevented.

The level shift circuit described in each of the exemplary embodiments described above may be formed on a single crystal semiconductor substrate using a CMOS process or the like. Alternatively, the level shift circuit may be formed on a TFT (Thin Film Transistor) substrate.

In the configuration example shown in FIG. 5, the example where the charging element in the level shifter 10 arranged on a higher potential side is formed of the P-channel transistor and the discharging element in the level shifter 20 arranged on a lower potential side is formed of the N-channel MOS transistor. Conductivity types of the transistors in the present invention are not of course limited to such a configuration. When the charging element in the level shifter 10 is formed of an N-channel MOS transistor, a drop corresponding to the threshold voltage of the N-channel MOS transistor is present in an output voltage. Depending on the application example, however, the first level shifter 10 may also be formed of the N-channel MOS transistors. Likewise, depending on the application example, the level shifter 20 may be formed of the P-channel transistors.

Each disclosure of Patent Documents 1 and 2 described above is incorporated herein by reference. Modifications and adjustments of examples or exemplary embodiments are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the basic technical concept.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A level shift circuit, comprising:
   an input terminal for receiving an input signal of a relatively low amplitude in a predetermined cycle;
   an output terminal for outputting an output signal in response to the input signal;
   a complementary output terminal for outputting a complementary value of the output signal of the output terminal;
   a first level shifter connected between a first power supply terminal that supplies a first voltage and the output terminal, the first level shifter setting the output terminal to a first voltage level when the input signal received at the input terminal assumes a first value;
   a second level shifter connected between the output terminal and a second power supply terminal that supplies a second voltage, the second level shifter setting the output terminal to a second voltage level when the input signal received at the input terminal assumes a complementary value of the first value; and
   a feedback control unit that performs switching between a selection of one of a voltage level at the output terminal and a voltage level at the complementary output terminal and a non-selection of the voltage level at the output terminal and the voltage level at the complementary output terminal, based on control signals supplied thereto in predetermined time intervals of the predetermined cycle, and supplies a signal with a selected voltage level to the first level shifter or to the first and second level shifters to perform a control of deactivating a level shift operation of at least one of the first level shifter and the second level shifter and to cause the output terminal to output the output signal in response to the input signal.

2. The level shift circuit according to claim 1, wherein a control time interval based on the control signals includes first through third time intervals within each time interval of the predetermined cycle,
   wherein the feedback control unit selects one of the voltage level at the output terminal and the voltage level at the complementary output terminal in the first time interval, selects neither the voltage level at the output terminal nor the voltage level at the complementary output terminal in the second time interval, and selects an other of the voltage level at the output terminal and the voltage level at the complementary output terminal in the third time interval, and
   wherein the input signal is supplied in the second time interval.

3. The level shift circuit according to claim 2,
   wherein the feedback control unit performs a control of deactivating the first level shifter during the first and second time intervals, when detecting that the output terminal assumes the first voltage level in a first time interval before a point of time at which the input signal is received, and
   wherein the second level shifter sets the output terminal to the second voltage level with a level shift operation of the first level shifter deactivated, when the input signal received in the second time interval assumes a value that sets the output terminal to the second voltage level.

4. The level shift circuit according to claim 3, wherein the feedback control unit, when detecting that the output terminal assumes the second voltage level in the first time interval, further performs control of deactivating the first level shifter during the first and second time intervals, and wherein, when the input signal supplied in the second time interval assumes a value that sets the output terminal to the first voltage level, the first level shifter sets the output terminal to the first voltage level with a level shift operation of the second level shifter being deactivated.

5. The level shift circuit according to claim 1, wherein a complementary signal of the input signal to be supplied to the first level shifter is supplied to the second level shifter.

6. The level shift circuit according to claim 1, wherein the first level shifter includes:
first through third transistors connected between the first power supply terminal and the second power supply terminal in series, the first through third transistors being arranged in this order from a side of the second power supply terminal; and
a fourth transistor connected between the first power supply terminal and the output terminal, wherein:
the first transistor comprises a first conductivity type, which is turned on when the input signal supplied to a control terminal thereof assumes the first value and is turned off when the input signal assumes the complementary value of the first value,
the second transistor comprises the first conductivity type, which is turned on when a control terminal thereof assumes a second value corresponding to the first voltage level and is turned off when the control terminal thereof assumes a complementary value of the second value,
the third and fourth transistors each comprise a second conductivity type, each of which is turned on when a control terminal thereof assumes the complementary value of the second value, and is turned off when the control terminal thereof assumes the second value,
the fourth transistor comprises a control terminal connected to a connection node between the second and third transistors,
the feedback control unit includes first and second switches having one ends thereof coupled together and other ends thereof respectively connected to the complementary output terminal and the output terminal, the first and second switches being controlled to be turned on or off in response to the control signals, and
the control terminals of the second and third transistors of the first level shifter are coupled together and connected to the one ends of the first and second switches of the feedback control unit, the one ends of the first and second switches being coupled together.

7. The level shift circuit according to claim 1, wherein the first level shifter includes:
first through third transistors connected between the first power supply terminal and the second power supply terminal in series, the first through third transistors being sequentially arranged from a side of the second power supply terminal; and
a fourth transistor connected between the first power supply terminal and the output terminal, wherein:
the first transistor comprises a first conductivity type, which is turned on when a control terminal thereof assumes a second value corresponding to the first voltage level and is turned off when the control terminal thereof assumes a complementary value of the second value,
the second transistor comprises the first conductivity type, which is turned on when the input signal supplied to a control terminal thereof assumes the first value and is turned off when the input signal assumes a complementary value of the first value,
the third and fourth transistors comprise a second conductivity type, each of which is turned on when a control terminal thereof assumes the complementary value of the second value, and is turned off when the control terminal thereof assumes the second value,
the fourth transistor comprises a control terminal connected to a connection node between the second and third transistors,
the feedback control unit includes first and second switches having one ends thereof coupled together and the other ends thereof respectively connected to the complementary output terminal and the output terminal, the first and second switches being controlled to be turned on or off in response to the control signals, and
the control terminals of the first and third transistors of the first level shifter are coupled together and connected to the one ends of the first and second switches of the feedback control unit, the one ends of the first and second switches being coupled together.

8. The level shift circuit according to claim 1, wherein the second level shifter includes a fifth transistor connected between the output terminal and the second power supply terminal, the fifth transistor comprising the first conductivity type, which is turned on when the complementary signal of the input signal supplied to a control terminal thereof assumes the first value and is turned off when the complementary signal of the input signal assumes the complementary value of the first value.

9. The level shift circuit according to claim 7, wherein the input signal is supplied in a predetermined cycle, wherein:
a control time interval of the first and second switches includes first through third time intervals within each time interval of the predetermined cycle,
in the first time interval, the feedback control unit turns on the first switch, and turns off the second switch,
in the second time interval, the feedback control unit turns off the first switch and turns off the second switch, and
in the third time interval, the feedback control unit turns off the first switch and turns on the second switch.

10. The level shift circuit according to claim 9, wherein a sum of the first time interval and the second time interval is shorter than the third time interval.

11. A semiconductor device including the level shift circuit as set forth in claim 1.

12. A level shift circuit, comprising:
an output terminal for outputting an output signal;
a complementary output terminal for outputting a complementary value of the output signal at the output terminal;
first through third transistors connected between a first power supply terminal that supplies a first voltage and a second power supply terminal that supplies a second voltage in series, the first through third transistors being arranged in this order from a side of the second power supply terminal;
a fourth transistor connected between the first power supply terminal and the output terminal;
a fifth transistor connected between the output terminal and the second power supply terminal; and
first and second switches having one ends thereof coupled together and the other ends thereof respectively connected to the complementary output terminal and the output terminal, the first and second switches being controlled to be turned on or off, in response to associated control signals respectively supplied thereto; wherein:
the first, second, and fifth transistors comprise a first conductivity type, the third and fourth transistors comprise a second conductivity type, an input signal of a relatively low amplitude relative to the output signal at the output terminal is supplied to one of control terminals of the first and second transistors, a complementary signal of the input signal is supplied to a control terminal of the fifth transistor, a control terminal of the fourth transistor is connected to a connection node between the second and third transistors, a control terminal of the third transistor and other of the control terminals of the first and second transistors are coupled together and connected to the one ends of the first and second switches, the one ends of the first and second switches being coupled together, the input signal is supplied in a predetermined cycle, a control time interval of the first and second switches includes first through third time intervals within each time interval of the predetermined cycle, in the first time interval, the first switch is turned on, and the second switch is turned off, based on the control signals, in the second time interval, the first switch is turned off, and the second switch is turned off, based on the control signals, in the third time interval, the first switch is turned off, and the second switch is turned on, based on the control signals, the input signal is supplied within the second time interval, and the output signal is output from the output terminal in response to the input signal at least in the third time interval.

* * * * *